(12) United States Patent
Wu et al.

(10) Patent No.: US 11,848,321 B2
(45) Date of Patent: Dec. 19, 2023

(54) SEMICONDUCTOR DEVICE FOR PROVIDING SPIKE VOLTAGE PROTECTION AND MANUFACTURING METHOD THEREOF

(71) Applicant: TAIWAN SEMICONDUCTOR MANUFACTURING COMPANY LTD., Hsinchu (TW)

(72) Inventors: Hong-Shyang Wu, Taipei (TW); Kuo-Ming Wu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 85 days.

(21) Appl. No.: 17/238,987

(22) Filed: Apr. 23, 2021

(65) Prior Publication Data
US 2022/0344323 A1    Oct. 27, 2022

(51) Int. Cl.
*H01L 27/02* (2006.01)
(52) U.S. Cl.
CPC ................. *H01L 27/0259* (2013.01)
(58) Field of Classification Search
None
See application file for complete search history.

(56) References Cited

U.S. PATENT DOCUMENTS

| | | | |
|---|---|---|---|
| 10,026,640 B2* | 7/2018 | Kalnitsky | ........... H01L 27/0259 |
| 2004/0065900 A1* | 4/2004 | Umemoto | ........... H01L 29/7371 |
| | | | 257/E29.189 |
| 2007/0090392 A1* | 4/2007 | Boselli | ................ H01L 27/0262 |
| | | | 257/107 |
| 2009/0237847 A1* | 9/2009 | Ryu | ..................... H01L 27/0262 |
| | | | 361/56 |
| 2011/0115393 A1* | 5/2011 | He | ...................... H05B 41/2881 |
| | | | 315/246 |
| 2017/0179109 A1* | 6/2017 | Toyoda | .................... H01L 29/06 |
| 2017/0317070 A1* | 11/2017 | Salcedo | .................... H04B 1/40 |
| 2021/0344336 A1* | 11/2021 | Salcedo | ................ H01L 29/742 |

* cited by examiner

*Primary Examiner* — Bilkis Jahan
(74) *Attorney, Agent, or Firm* — WPAT Law; Anthony King

(57) ABSTRACT

A semiconductor device is provided. The semiconductor device comprises an output circuit configured to be electrically connected between a driving circuit and an external load circuit, and a protection circuit electrically connected to the output circuit and the driving circuit. The protection circuit comprises a first transistor having a base electrode, a collector electrode and an emitter electrode and a second transistor having a base electrode, a collector electrode and an emitter electrode. The base electrode of the first transistor is electrically connected to the collector electrode of the second transistor.

20 Claims, 19 Drawing Sheets

SEMICONDUCTOR DEVICE FOR PROVIDING SPIKE VOLTAGE PROTECTION AND MANUFACTURING METHOD THEREOF

BACKGROUND

The present invention relates generally to semiconductor devices, and more particularly to a semiconductor device for providing spike voltage protection and the manufacturing method thereof.

Spike voltages occur when current suddenly changes in an external inductive load circuit. Semiconductor devices of ICs can be damaged by spike voltages. For example, when current changes in an external inductive load circuit, a spike voltage can be generated and coupled between the external inductive load circuit and an electrode (e.g., gate electrode) of a semiconductor device of a semiconductor wafer, causing abnormally high voltages in the semiconductor wafer that can damage the semiconductor devices of the semiconductor wafer. These abnormally high voltages can damage the semiconductor devices of the semiconductor wafer by, for example, blowing out the gate oxide. Spike voltage protection has thus been developed.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
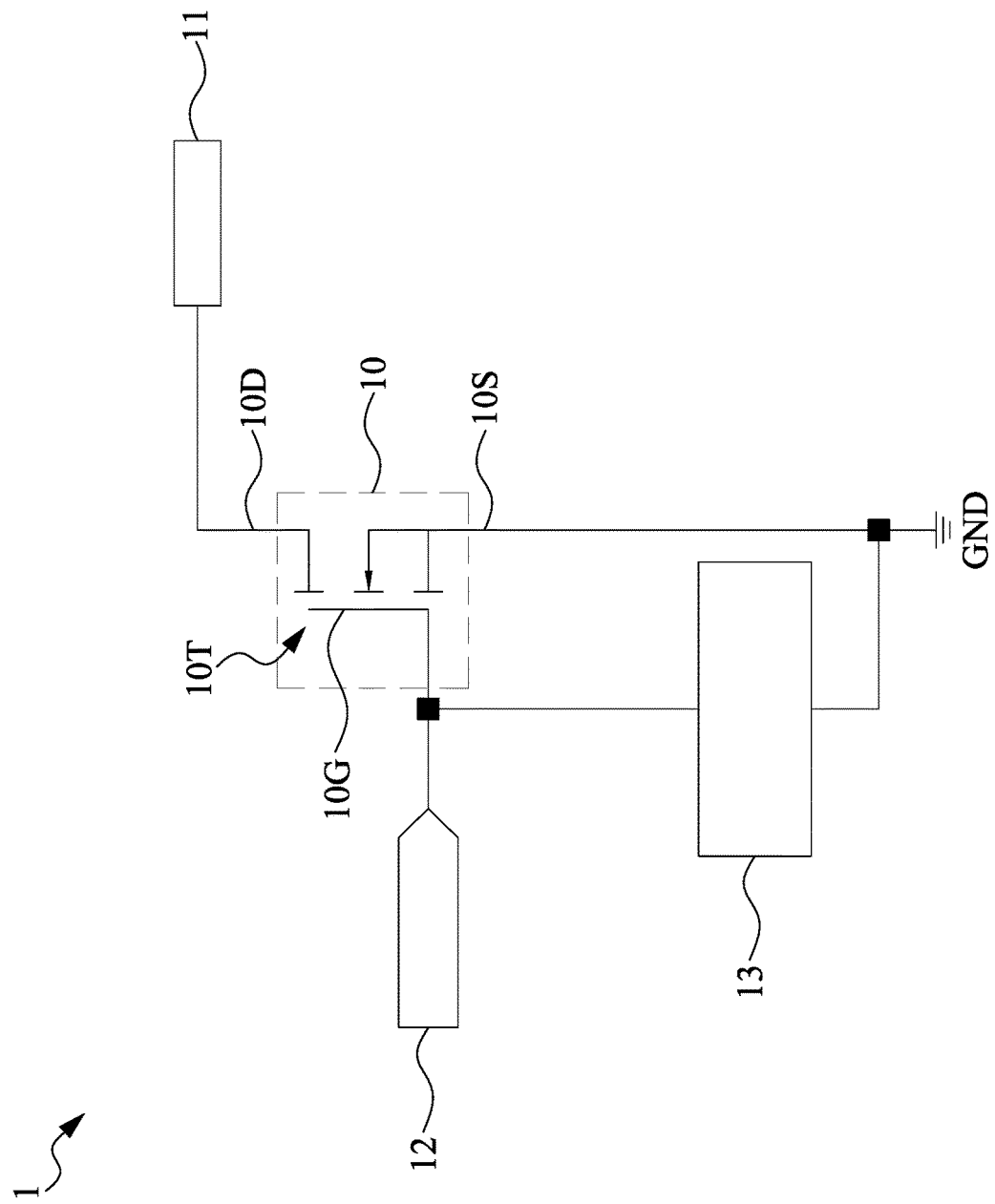
FIG. 1 illustrates a schematic diagram of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

An input/output circuit of a semiconductor device of an IC is highly susceptible to damage, including that sustained from spike voltages. When current changes in an external inductive load circuit occur, spike voltage is generated and coupled between the external inductive load circuit and an electrode of the input/output circuit of a semiconductor wafer. Spike voltages may damage the gate electrode (specifically the gate oxide) of the gate electrode of a metal-oxide-semiconductor field-effect transistor (MOSFET), gas one example. Therefore, a protection circuit is needed to protect the gate electrode from spike voltages.

Zener diodes are commonly used for spike voltage protection in circuitry. However, leakage current from the Zener diodes is high and causes undesired power loss. The implantation process utilized in the manufacturing process of the Zener diodes makes it difficult to manufacture the diodes with lower leakage current and lower breakdown voltage (e.g., less than 5V). In the present disclosure, protection circuits especially suited to withstand spike voltages are proposed.

FIG. 1 illustrates a schematic diagram of a semiconductor device, in accordance with some embodiments of the present disclosure.

FIG. 1 shows a schematic diagram of a semiconductor device 1. The semiconductor device 1 can be a part of an electronic system. The semiconductor device 1 can be arranged in an output stage of an electronic system. The semiconductor device 1 includes an output circuit 10, a driving circuit 12, and a protection circuit 13. The semiconductor device 1 can be electrically connected to an external load circuit 11.

The output circuit 10 includes a transistor 10T. In some embodiments, the output circuit 10 can include a p-type MOSFET (PMOS). In some embodiments, the output circuit 10 can include an n-type MOSFET (NMOS). In some embodiments, the output circuit 10 can include more than one transistor. In some embodiments, the output circuit 10 can include electronic circuits in addition to the transistor 10T.

In some embodiments, the external load circuit 11 can be electrically connected to a drain electrode 101) of the transistor 10T. The driving circuit 12 can be electrically connected to a gate electrode 10G of the transistor 10T. The protection circuit 13 can be electrically connected between the gate electrode 10G and a source electrode 10S of the transistor 10T.

The external load circuit 11 can be an inductive load. The external load circuit 11 can have an inductance L. When a current change occurs in the external load circuit 11, spike voltage may occur. Spike voltage can be calculated based on the following equation.

$$V_{spike} = L * di/dt \quad \text{(equation 1)}$$

According to the equation 1, spike voltage $V_{spike}$ is associated with a rate of change of the current. Since the current change on the external load circuit 11 can be rapid, spike voltage $V_{spike}$ can be very high. Afterwards, spike voltage $V_{spike}$ will be coupled to the gate electrode 10G of the transistor 10T via a parasite capacitance (not shown) between the gate electrode 10G and the drain electrode 10D of the transistor 10T. The protection circuit 13 can protect the gate electrode 10G of the transistor 10T from damage when spike voltage $V_{spike}$ exceeds a threshold voltage $V_{TH}$ of the protection circuit 13. That is, when spike voltage $V_{spike}$ exceeds the threshold voltage $V_{TH}$ of the protection circuit 13, the protection circuit 13 can redirect spike voltage $V_{spike}$ and the current induced by spike voltage $V_{spike}$ to ground (GND). Therefore, the protection circuit 13 can protect the output circuit 10 from being damaged by spike voltage $V_{spike}$ or the current induced thereby.

Figure 2A:
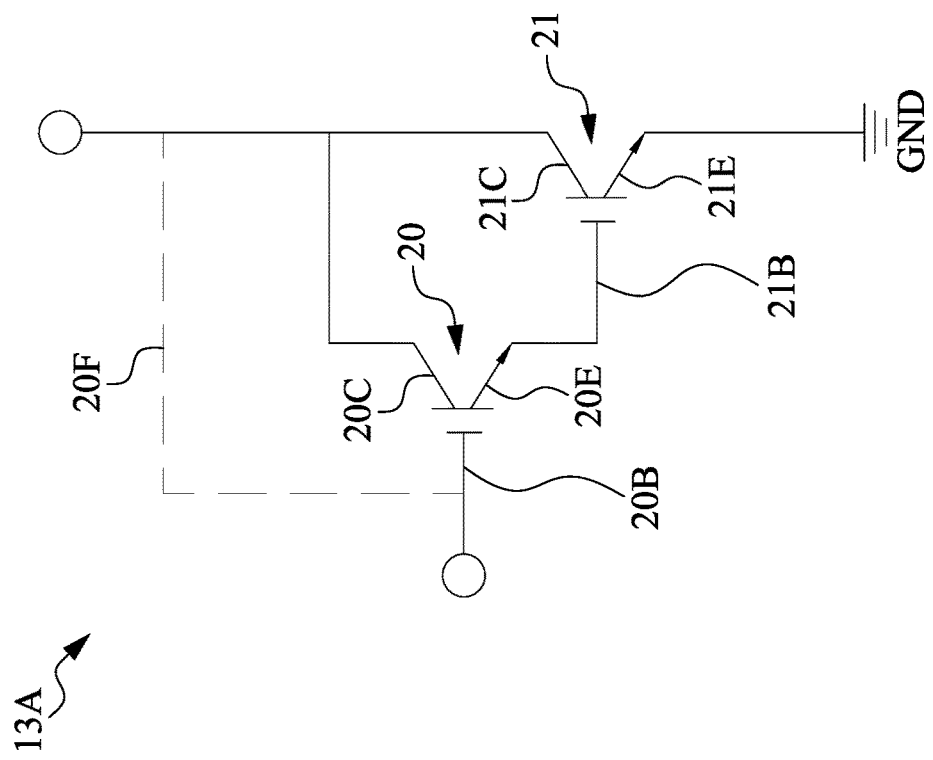
FIG. 2A illustrates a schematic diagram of a protection circuit, in accordance with some embodiments of the present disclosure.

FIG. 2A illustrates a schematic diagram of a protection circuit, in accordance with some embodiments of the present disclosure. FIG. 2A shows a protection circuit 13A, one possible embodiment of the protection circuit 13 of FIG. 1. The protection circuit 13A includes transistors 20 and 21. The transistors 20 and 21 can be bipolar junction transistors (BJT). The transistors 20 and 21 can be electrically connected in series. The base electrode 20B of the transistor 20 is electrically connected to the collector electrode 20C of the transistor 20. The base electrode 20B of the transistor 20 can be electrically connected to the collector electrode 20C of the transistor 20 through a connection element 20F. The emitter electrode 20E of the transistor 20 is electrically connected to the base electrode 21B of the transistor 21. The collector electrode 20C of the transistor 20 is electrically connected to the collector electrode 21C of the transistor 21. The base electrode 20B of the transistor 20 is electrically connected to the collector electrode 21C of the transistor 21. The emitter electrode 21E of the transistor 21 is electrically connected to the output circuit 10. In some embodiments, the emitter electrode 21E of the transistor 21 can be electrically connected to the ground (GND).

In some embodiments, the transistors 20 and 21 can be NPN bipolar junction transistors (BJT). In some embodiments, the transistors 20 and 21 can be PNP bipolar junction transistors (BJT). The configuration of the transistors 20 and 21 in FIG. 2A can be equivalent to two diodes electrically connected in series. That is, the protection circuit 13A can be equivalent to a two-terminal device. The breakdown voltage of the transistors 20 and 21 ranges approximately from 0.6V to 0.8V. The breakdown voltage of the transistors 20 and 21 may be 0.7V. The transistors 20 and 21 can protect the gate electrode 10G of the transistor in from damage when spike voltage induced at the gate electrode 10G exceeds approximately 2*0.7=1.4V. That is, the threshold voltage $V_{TH}$ for the protection circuit 13A is approximately 2*0.7=1.4V.

Figure 2B:
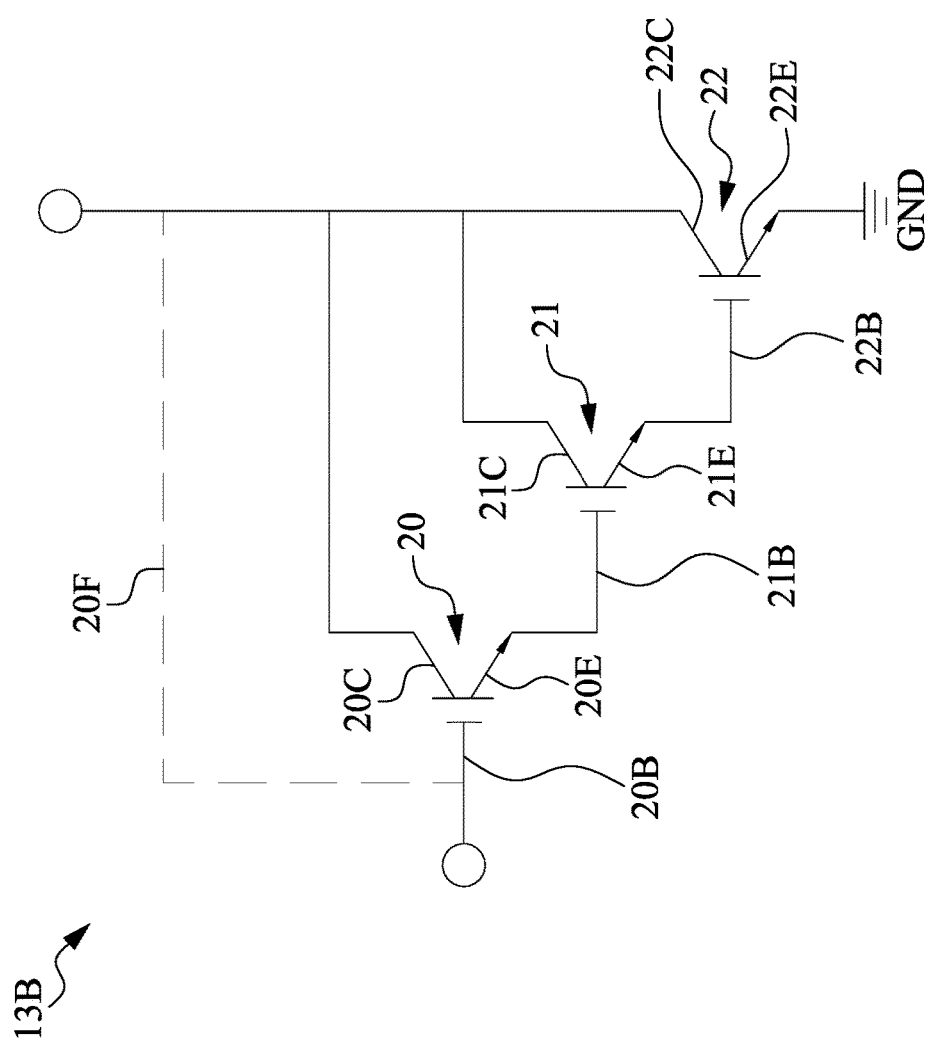
FIG. 2B illustrates a schematic diagram of a protection circuit, in accordance with some embodiments of the present disclosure.

FIG. 2B illustrates a schematic diagram of a protection circuit, in accordance with some embodiments of the present disclosure. FIG. 2B shows a protection circuit 13B. The protection circuit 13B shown in FIG. 2B can be one embodiment of the protection circuit 13 of FIG. 1.

The protection circuit 13B includes more than two transistors. The protection circuit 13B includes three transistors 20, 21 and 22. The transistors 20, 21 and 22 can be electrically connected in series. A base electrode 22B of the transistor 22 is electrically connected to the emitter electrode 21E of the transistor 21. The collector electrode 22C of the transistor 22 is electrically connected to the collector electrode 21C of the transistor 21. The collector electrode 22C of the transistor 22 is electrically connected to the collector electrode 20C of the transistor 20. The collector electrode 22C of the transistor 22 is electrically connected to the base electrode 20B of the transistor 20. The collector electrode 22C of the transistor 22 can be electrically connected to the base electrode 20B of the transistor 20 through a connection element 20F. The breakdown voltage of the transistors 20 to 22 ranges approximately from 0.6V to 0.8V. The breakdown voltage of the transistors 20 to 22 may be 0.7V. The transistors 20 to 22 can protect the gate electrode 10G of the transistor 10T from damage when the voltage spike induced at the gate electrode 10G exceeds approximately 3*0.7=2.1V. That is, the threshold voltage $V_{TH}$ for the protection circuit 13B is approximately 3*0.7=2.1V.

Comparing the protection circuit 13B with the protection circuit 13A, it can be seen that the threshold voltage $V_{TH}$ of the protection circuit is adjustable.

Figure 2C:
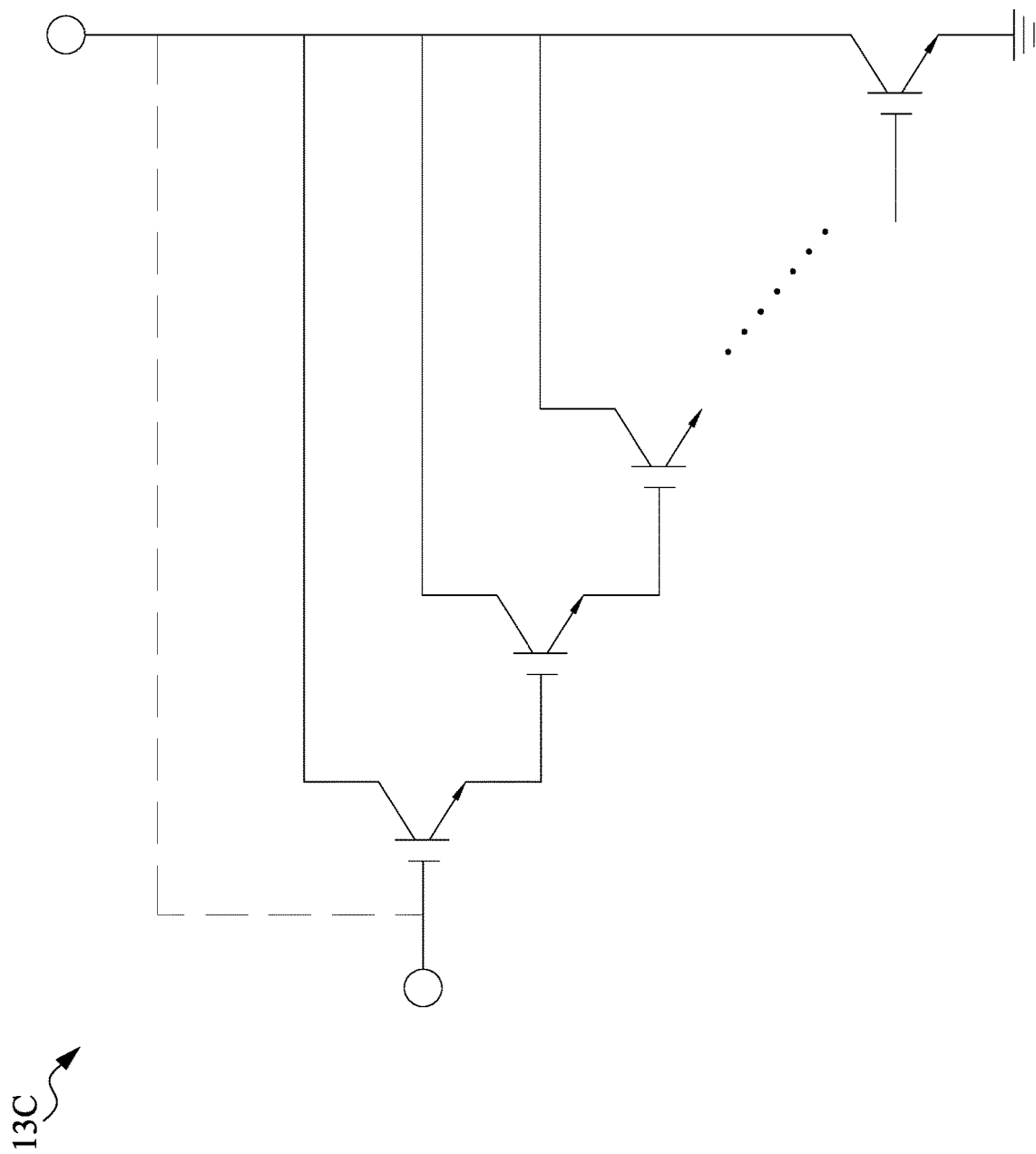
FIG. 2C illustrates a schematic diagram of a protection circuit, accordance with some embodiments of the present disclosure.

FIG. 2C illustrates a schematic diagram of a protection circuit, in accordance with some embodiments of the present disclosure. FIG. 2C shows a protection circuit 13C. The protection circuit 13C shown in FIG. 2C can be one embodiment of the protection circuit 13 of FIG. 1. The protection circuit 13C includes a quantity N of transistors electrically connected in series.

The N transistors of the protection circuit 13C can be connected in a manner similar to those shown in FIG. 2A or FIG. 2B. The collector electrodes of the N transistors are electrically connected.

The breakdown voltage of the N transistors of the protection circuit 13C ranges approximately from 0.6V to 0.8V. If the breakdown voltage of the N transistors of the protection circuit 13C is 0.7V, then the threshold voltage $V_{TH}$ of the protection circuit 13C will be approximately N*0.7 V. The breakdown voltage of the protection circuit 13C can be set and adjusted by the number of BJTs electrically connected in series.

In addition, if transistors are electrically connected in series in the protection circuit 13C, the protection circuit 13C can be considered a diode. If more transistors are electrically connected in series in the protection circuit 13C, the equivalent capacitance of the protection circuit 13C will lower. The RC delay of the protection circuit 13C can be lower. The reverse recovery charge of the protection circuit 13C can be reduced. The response time of the protection circuit 13C can be reduced.

Figure 3A:
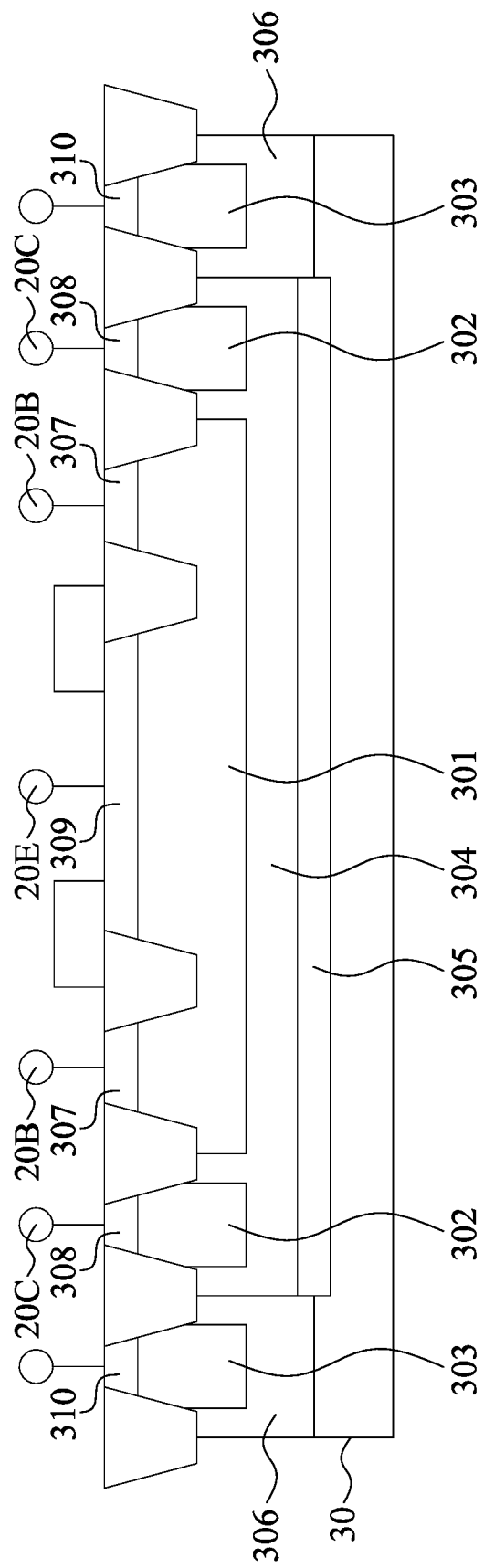
FIG. 3A illustrates a cross-sectional view of a transistor, in accordance with some embodiments of the present disclosure.

FIG. 3A illustrates a cross-sectional view of a transistor, in accordance with some embodiments of the present disclosure.

The cross-sectional view in FIG. 3A can correspond to the structure of the transistor 20 in FIG. 2A. A P-type well region 301 is embedded within a p-type substrate 30. An n-type doping region 302 is embedded within the p-type substrate 30. The n-type doping region 302 surrounds the P-type well region 301. A p-type doping region 303 is embedded within the p-type substrate 30. The p-type doping region 303 surrounds the P-type well region 301. The p-type doping region 303 surrounds the n-type doping region 302.

A lightly doped n-type well region 304 is embedded within the p-type substrate 30. The lightly doped n-type well region 304 is formed under the P-type well region 301. The lightly doped n-type well region 304 is formed under the p-type well region 301. The lightly doped n-type well region 304 surrounds the p-type well region 301. The lightly doped n-type well region 304 is formed under the n-type doping region 302. The lightly doped n-type well region 304 surrounds the n-type doping region 302. An n-type barrier layer 305 is embedded within the p-type substrate 30. The n-type barrier layer 305 is formed under the lightly doped n-type well region 304. A lightly doped p-type well region 306 is embedded within the p-type substrate 30. The lightly doped p-type well region 306 is formed under the p-type doping region 303.

A P+ well region 307 is embedded within the P-type well region 301. An N+ well region 308 is embedded within the n-type doping region 302. The N+ well region 308 surrounds the P+ well region 307. An N+ well region 309 is embedded within the P-type well region 301. The P+ well region 307 surrounds the N+ well region 309. The N+ well region 308 surrounds the N+ well region 309. A P+ well region 310 is embedded within the p-type doping region 303. The well region 310 surrounds the N+ well region 308.

The base electrode 20B of the transistor 20 is formed of the P+ well region 307. The collector electrode 20C of the transistor 20 is formed of the N+ well region 308. The emitter electrode 20E of the transistor 20 is formed of the N+ well region 309.

Figure 3B:
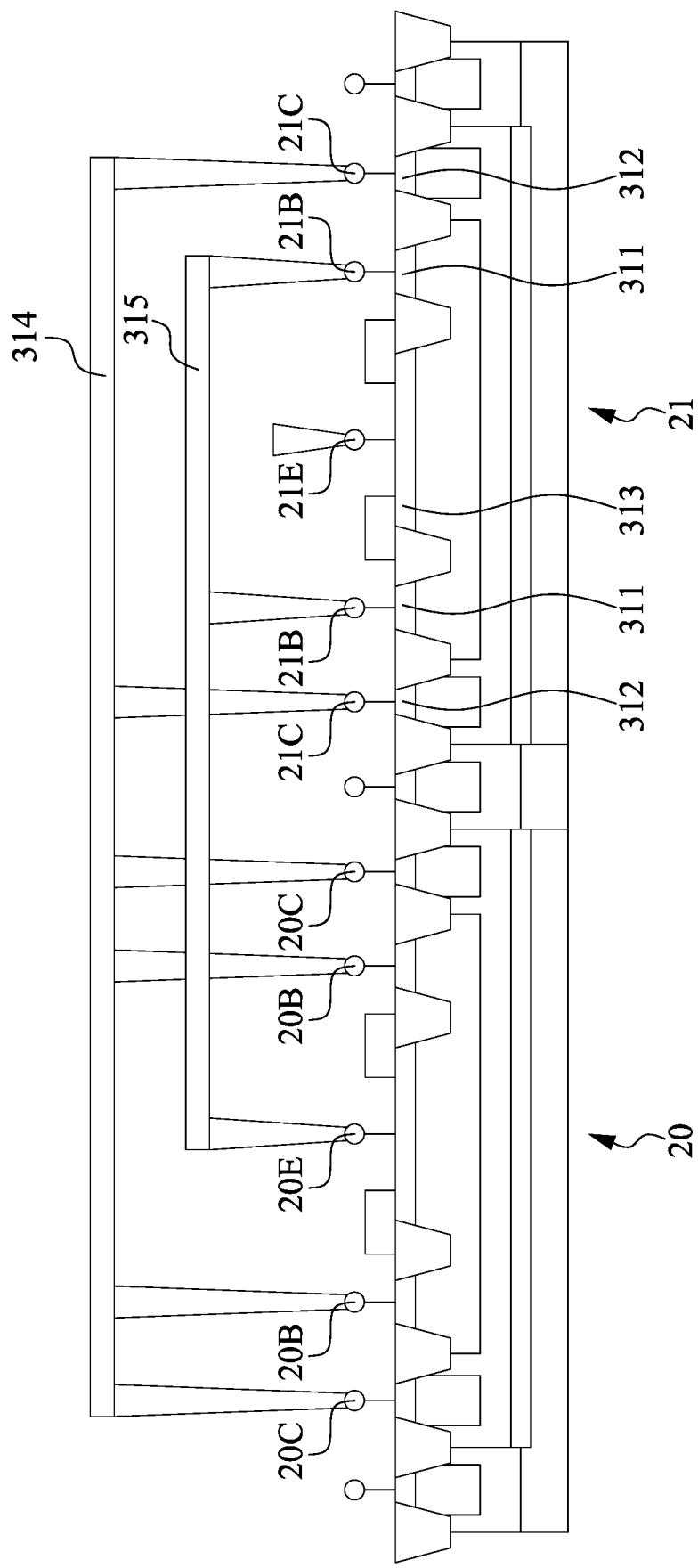
FIG. 3B illustrates a cross-sectional view of a protection circuit, in accordance with some embodiments of the present disclosure.

FIG. 3B illustrates a cross-sectional view of a protection circuit, in accordance with some embodiments of the present disclosure.

The cross-sectional view cross-section in FIG. 3B can correspond to the protection circuit 13A of FIG. 2A, and to transistors 20 and 21 electrically connected in series. The structure of the transistor 21 is the same as that of the transistor 20.

As shown in FIG. 3B, the base electrode 21B of the transistor 21 is formed of the P+ well region 311. The collector electrode 21C of the transistor 21 is formed of the N+ well region 312. The emitter electrode 21E of the transistor 21 is formed of the N+ well region 313.

The base electrode 20B and the collector electrode 20C of the transistor 20 are electrically connected via a conductive element 314. The collector electrode 21C of the transistor 21 is electrically connected to the base electrode 20B and the collector electrode 20C of the transistor 20 via the conductive element 314. The emitter electrode 20E of the transistor 20 is electrically connected to the base electrode 21B of the transistor 21 via a conductive element 315. The conductive element 314 is formed above the conductive element 315. The conductive elements 314 and 315 may include the same material. The conductive elements 314 and 315 may include a metal material. The conductive elements 314 and 315 may include different materials.

Figure 4A:
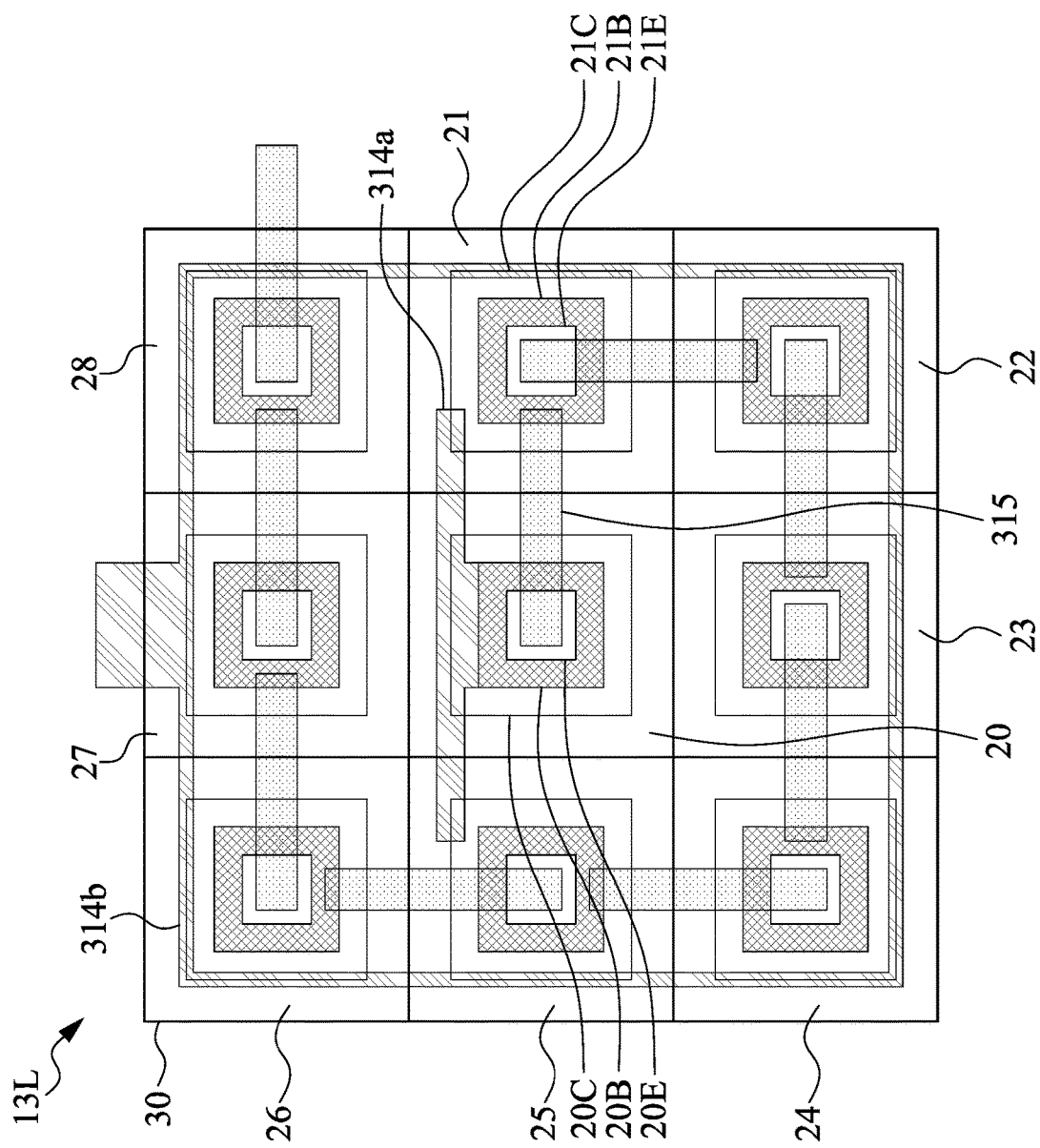
FIG. 4A illustrates a layout of a protection circuit accordance with some embodiments of the present disclosure.

FIG. 4A illustrates a layout of a protection circuit, in accordance with some embodiments of the present disclosure, specifically a layout 13L of multiple BJTs electrically connected in series.

The layout 13L, shown in FIG. 4A can correspond to a protection circuit using BJTs. If a BJT can be surrounded by other BJTs in the layout, it will be more stable during both operation and manufacture. By arranging the BJTs in a manner similar to that shown in FIG. 4A, the BJTs of the protection circuit can be well controlled in terms of operation and manufacture.

The layout 13L shown in FIG. 4A includes BJTs 20-28. The BJTs 20-28 can be arranged in a 3×3 matrix. This arrangement can be referred to as a 1:8 BJT pattern in the present disclosure (i.e., one BJT 20 in the center with eight BJTs 21-28 surrounding it). In some embodiments, BJTs of different values can be arranged in a manner similar to that shown in FIG. 4A. For example, four BJTs can be arranged in a 2×2 matrix; sixteen BJTs can be arranged in a 4×4 matrix; twenty five BJTs can be arranged in a 5×5 matrix, and etc.

In some embodiments, the number of the BJTs in a BJT pattern can be calculated based on the following equation below, wherein N is an integer of 2 or greater.

$$1:(2N-1)^2-1 \qquad \text{(equation 2)}$$

Referring to FIG. 4A, BJTs 20 to 28 can be formed on the substrate 30. The emitter electrode 20E, the base electrode 20B and the collector electrode 20C of the BJT 20 are formed on the substrate 30. The emitter electrode 21E, the base electrode 21B, and the collector electrode 21C of the BJT 21 are formed on the substrate 30. The emitter electrodes, the base electrodes, and the collector electrodes of the BJTs 22-28 are formed on the substrate 30.

Regarding the RIF 20, the collector electrode 20C surrounds the base electrode 20B. The base electrode 20B surrounds the emitter electrode 20E. The collector electrode 20C surrounds the emitter electrode 20E. Regarding the BJT 21, the collector electrode 21C surrounds the base electrode 21B. The base electrode 21B surrounds the emitter electrode 21E. The collector electrode 21C surrounds the emitter electrode 21E. The collector electrodes, the base electrodes and the emitter electrodes of the BJTs 22-28 can be arranged in a manner similar to those of the BJTs 20 and 21.

The collector electrodes of the BJTs 20 to 28 are electrically connected. Referring to FIG. 4A, the collector electrodes of the BJTs 20, 21 and 25 can be electrically connected by the conductive element 314a. The collector electrodes of the BJTs 20 to 28 can be electrically connected by the conductive element 314b. The base electrode 20B and the collector electrode 20C of the BJT 20 can be electrically connected by the conductive element 314a. The emitter electrode 20E of the BJT 20 and the base electrode 21B of the BJT 21 can be electrically connected by a conductive element 315.

The layout 13L, shown in FIG. 4A pertains to a specific embodiment of a protection circuit that includes nine BJTs. However, it can be contemplated that a layout similar to the layout 13L can also be applied to the protection circuit 13A of FIG. 2A, the protection circuit 13B of FIG. 2B, and the protection circuit 13C of FIG. 2C.

In some embodiments, with appropriate electrical connections, the protection circuit 13A of FIG. 2A can be implemented by any two BJTs of the layout 13L shown in FIG. 4A.

In some embodiments, with appropriate electrical connections, the protection circuit 13B of FIG. 2B can be implemented by any three BJTs of the layout 13L, shown in FIG. 4A.

The protection circuit 13C of FIG. 2C includes a quantity N of BJTs. With appropriate selection of the size of the matrix, for example, in accordance with the equation 2, the protection circuit 13C of FIG. 2C can be implemented using a layout similar to that shown in FIG. 4A.

Figure 4B:
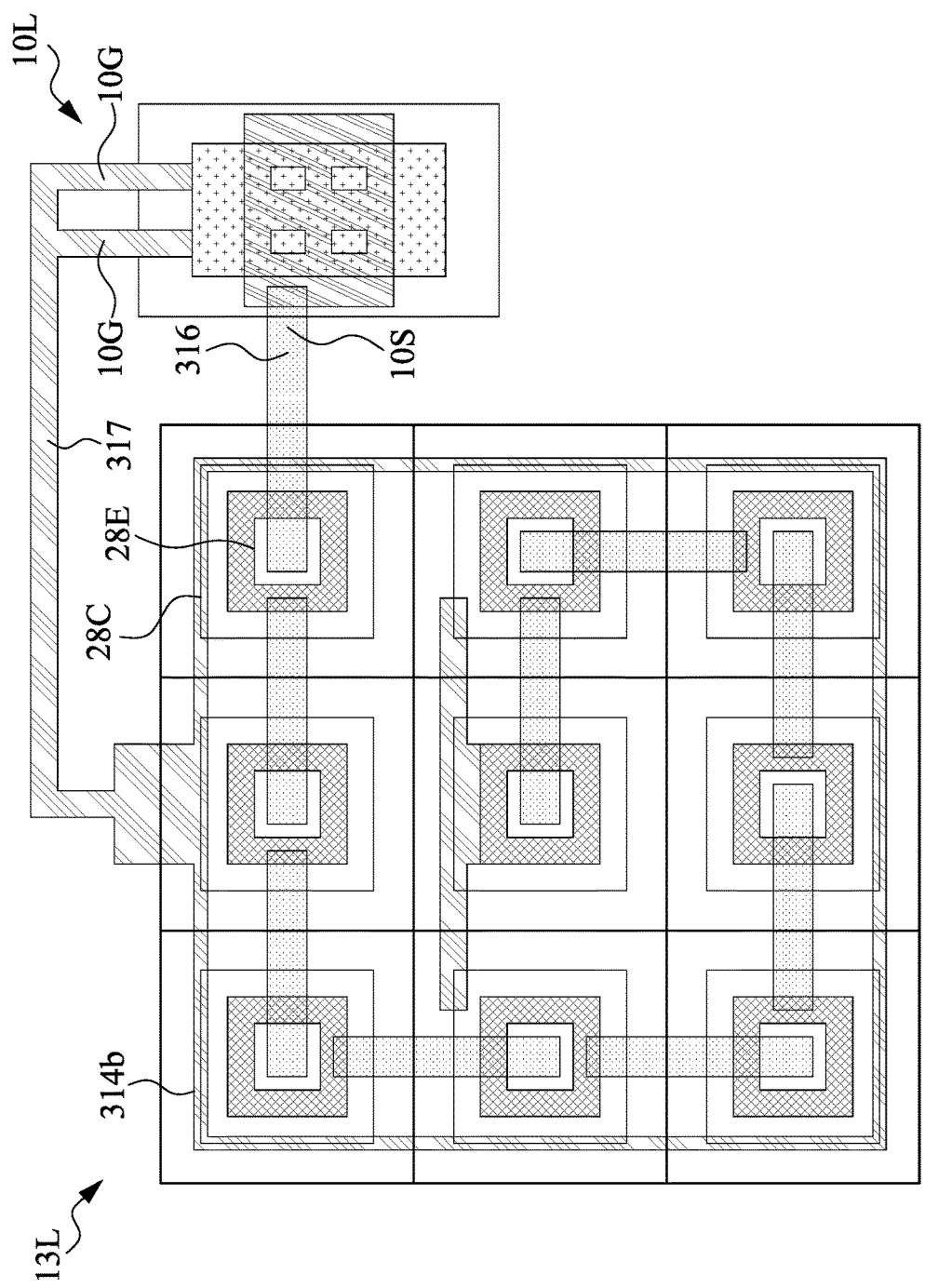
FIG. 4B illustrates a layout of a semiconductor device, in accordance with some embodiments of the present disclosure.

FIG. 4B illustrates a layout of a semiconductor device, in accordance with some embodiments of the present disclosure.

A layout shown in FIG. 4B illustrates electrical connections between a protection circuit and an output circuit. The layout includes a layout 13L, pertaining to a protection circuit, and a layout 10L pertaining to an output circuit. The layout 13L of FIG. 4B is identical to the layout 13L of FIG. 4A. The layout 13L of FIG. 4B includes nine BJTs (i.e., BJTs. 20-28, among which only the BJT 28 is labeled). The layout 10L of FIG. 4B corresponds to the transistor 10T of FIG. 1.

The emitter electrode 28E of the BJT 28 is electrically connected to the source electrode 10S of the transistor 10T. In some embodiments, the emitter electrode 28E of the BJT 28 can be electrically connected to the source electrode 10S of the transistor 10T through a conductive element 316.

The collector electrode 28C of the 28 is electrically connected to the gate electrode 10G of the transistor 10T. In some embodiments, the collector electrode 28C of the BJT 28 can be electrically connected to the gate electrode 10G of the transistor 10T through conductive elements 314 and 317.

The collector electrodes of the BJTs 20-28 are electrically connected to the gate electrode 10G of the transistor 10T. In some embodiments, the collector electrodes of the BJTs 20-28 can be electrically connected to the gate electrode 10G of the transistor 10T through conductive elements 314 and 317.

Figure 5A:
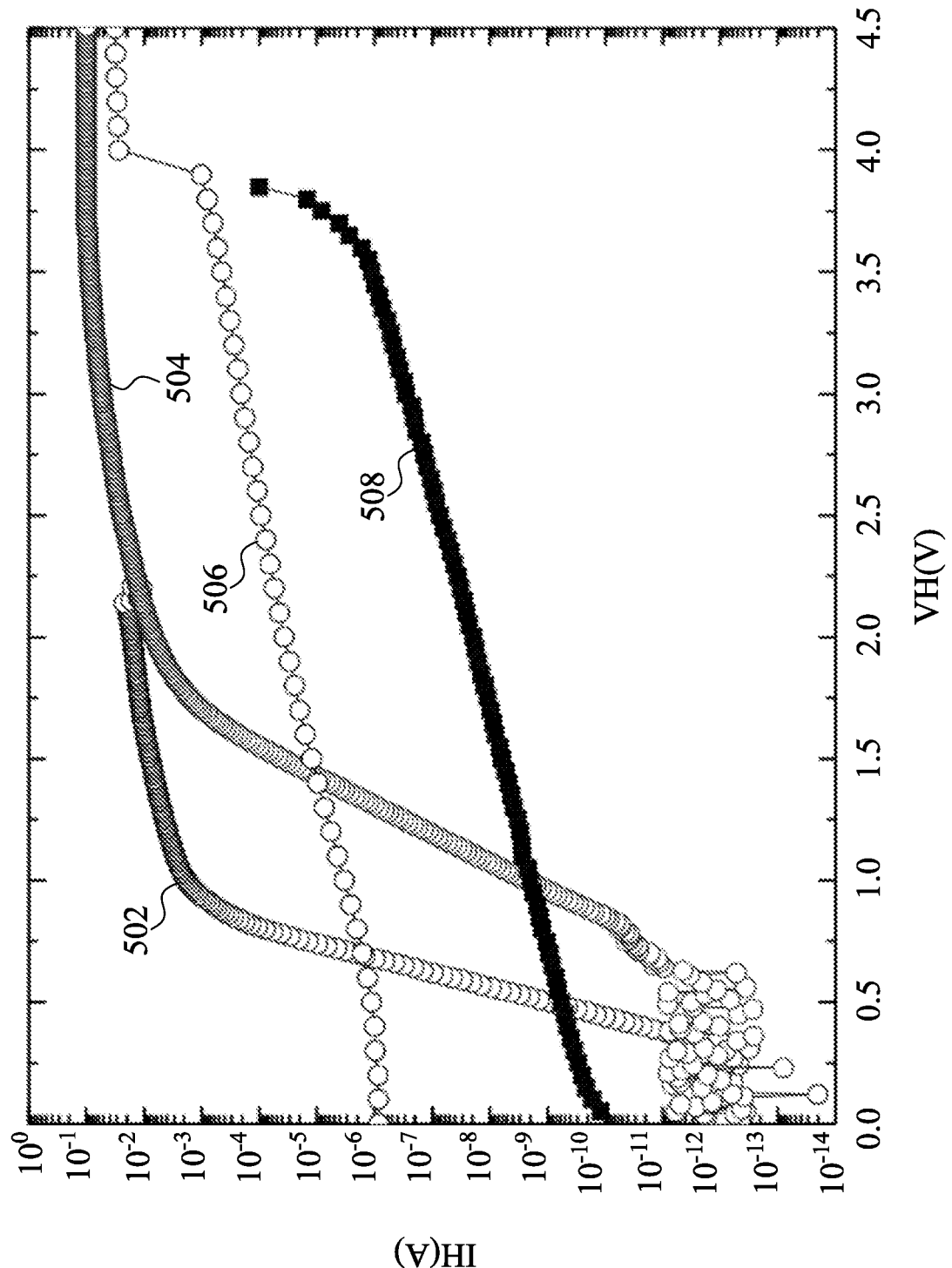
FIG. 5A illustrates a diagram including I-V curves of various protection circuits, in accordance with some embodiments of the present disclosure.

FIG. 5A illustrates a diagram including I-V curves of various protection circuits, in accordance with some embodiments of the present disclosure.

FIG. 5A shows I-V curves 502, 504, 506 and 508. The I-V curve 502 represents a protection circuit that includes a single BJT with its base electrode and emitter electrode connected. The I-V curve 504 represents a protection circuit that includes two BJTs each with their base electrode and emitter electrode connected. The I-V curve 506 represents a protection circuit that includes an N+/P+ Zener diode. The I-V curve 508 represents a protection circuit using an NMOS. The NMOS is a part of a complementary metal-oxide-semiconductor (CMOS).

Referring to FIG. 5A, the horizontal (X) axis maps the voltage applied to the protection circuit. For a protection circuit that includes BJTs, the horizontal axis maps the voltage $V_{CE}$ applied between the collector electrode and the emitter electrode of a BJT. For a protection circuit that includes MOSFETs, the horizontal axis maps the voltage $V_D$ applied to the drain electrode of a MOSFET. The vertical axis (Y) maps the current through the protection circuit. For a protection circuit that includes BJTs, the vertical axis maps current $I_C$ of the collector electrode. For a protection circuit that includes MOSFETs, the vertical axis maps current $I_D$ of the drain electrode.

Performance of the protection circuits is associated with their breakdown voltages, and can also be associated with their off-state current. In some embodiments, the breakdown voltage can be defined as the voltage applied to the protection circuit when an off-state current of the protection circuit is $10^{-6}$ A.

In FIG. 5A, the breakdown voltage of the protection circuit represented by the I-V curve 502 is approximately 0.7V, and the breakdown voltage of the protection circuit represented by the I-V curve 504 is approximately 1.4 V. Comparing the I-V curves 502 and 504, it can be seen that if the protection circuit uses more transistors electrically connected in series, the breakdown voltage of the protection circuit increases. Therefore, the breakdown voltage of a protection circuit can be associated with the quantity of transistors used within the protection circuit. A protection circuit with an expected breakdown voltage can be obtained by appropriately selecting the quantity of transistors used within the protection circuit.

Referring to FIG. 5A, when a low voltage is applied, the off-state current of the protection circuit represented by the I-V curve 506 is higher than the off-state currents of the protection circuits represented by the I-V curves 502 and 504. As a result, although a N+/P+ Zener diode can be utilized as a protection circuit, it will exhibit higher current leakage, and thus higher power consumption.

Referring to the I-V curve 508 in FIG. 5A, the protection circuit represented by the I-V curve 508 includes the NMOS having a gate electrode width of 0.27 µm. The length of the gate electrode of the NMOS is 0.036 µm. According to FIG. 5A, when a low voltage is applied, the off-state current of the protection circuit represented by the I-V curve 508 is much higher than the off-state currents of the protection circuits represented by the I-V curves of 502 and 504. As a result, although a NMOS can be utilized as a protection circuit, it will exhibit a higher current leakage, and thus higher power consumption.

Figure 5B:
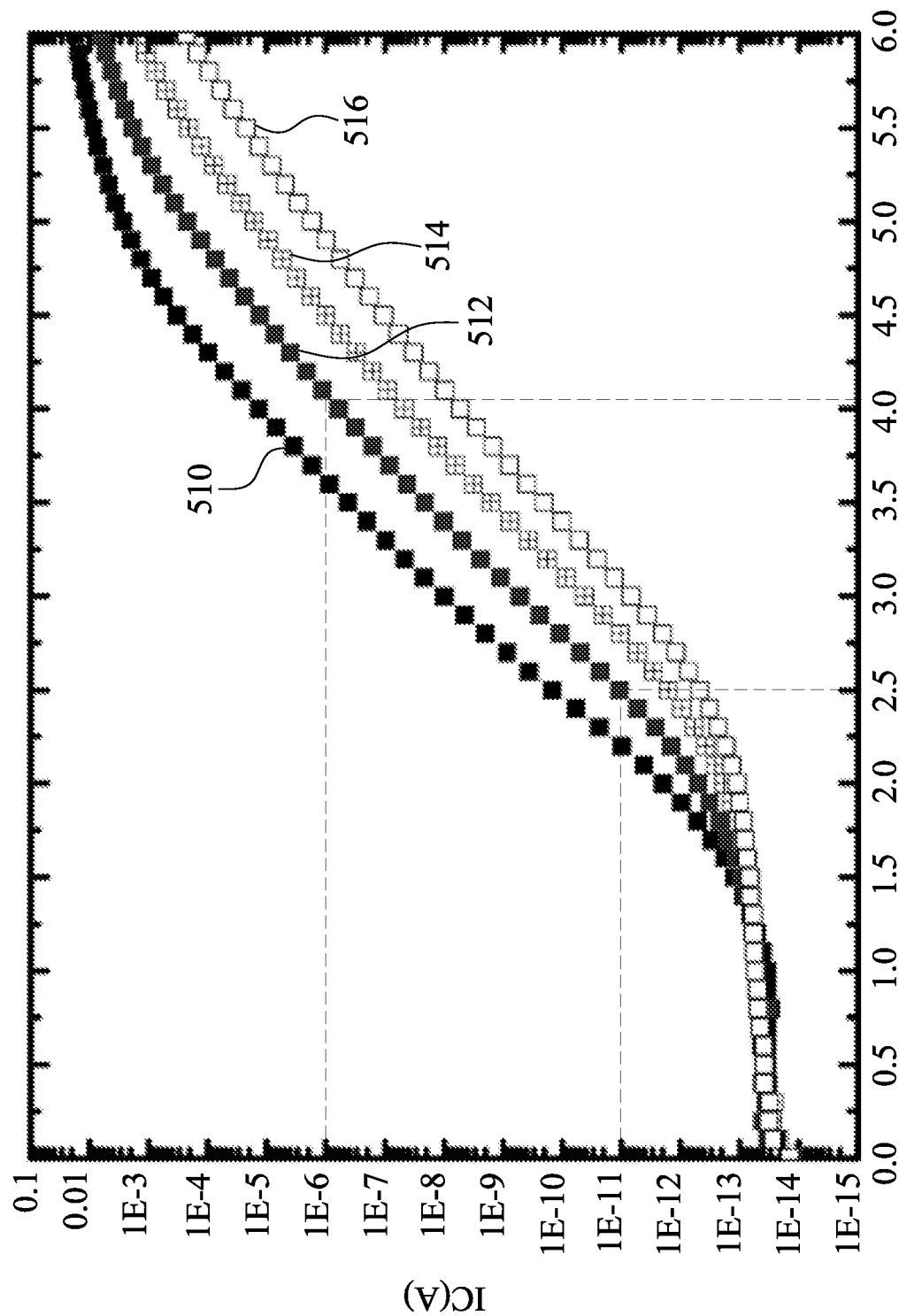
FIG. 5B illustrates a diagram including I-V curves of various protection circuits, in accordance with some embodiments of the present disclosure.

FIG. 5B illustrates a diagram including I-V curves of various protection circuits, in accordance with some embodiments of the present disclosure. The protection circuits can be formed of BJTs electrically connected in series. In the embodiments of FIG. 5B, BJTs with emitter electrode size of 2 µm×2 µm are used for various protection circuits.

FIG. 5B shows I-V curves 510, 512, 514 and 516. The I-V curve 510 represents a protection circuit that includes six BJTs electrically connected in series. The I-V curve 512 represents a protection circuit that includes seven BJTs electrically connected in series. The I-V curve 514 represents a protection circuit that includes eight BJTs electrically connected in series. The I-V curve 516 represents a protection circuit that includes nine BJTs electrically connected in series.

Referring to FIG. 5B, the breakdown voltage of the protection circuit represented by the I-V curve 512 is approximately 4.2 V. In addition, FIG. 5B shows that when a voltage of 2.5V is applied to the protection circuit represented by the I-V curve 512, the off-state current of the protection circuit represented by the I-V curve 512 is approximately $8.0 \times 10^{-12}$ A.

When comparing the I-V curves 510, 512, 514, and 516, it can be seen that if more BJTs are electrically connected in series, the breakdown voltage can lye higher. Furthermore, the slope of the I-V curve decreases as more BJTs are electrically connected in series. That is, when more BJTs connected in series are included by a protection circuit, the on-state resistance of the protection circuit increases. Accordingly, a protection circuit with an expected on-state resistance and/or breakdown voltage can be obtained by appropriately selecting the number of BJTs used within the protection circuit.

Figure 5C:
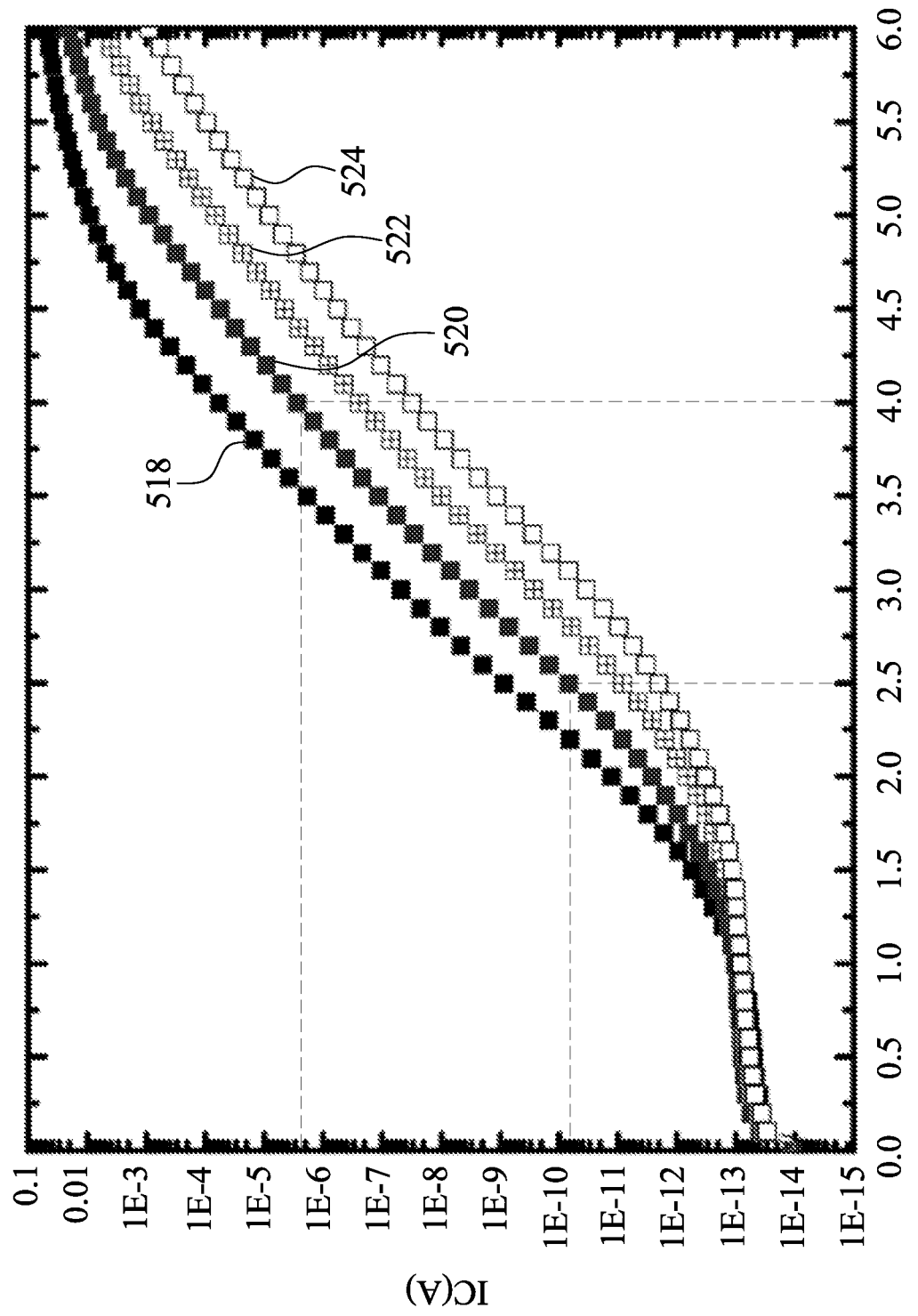
FIG. 5C illustrates a diagram including I-V curves of various protection circuits, in accordance with some embodiments of the present disclosure.

FIG. 5C illustrates a diagram including I-V curves of various protection circuits, in accordance with some embodiments of the present disclosure. The protection circuits can be formed of BJTs electrically connected in series.

FIG. 5C shows I-V curves 518, 520, 522 and 524. The I-V curve 518 represents a protection circuit that includes six BJTs electrically connected in series. The I-V curve 520 represents a protection circuit that includes seven BJTs electrically connected in series. The I-V curve 522 represents a protection circuit that includes eight BJTs electrically connected in series. The I-V curve 524 represents a protection circuit that includes nine BJTs electrically connected in series. In the embodiments of FIG. 5C, BJTs with emitter electrode size of 5 µm×5 µm are used for various protection circuits.

Referring to FIG. 5C, the breakdown voltage of the protection circuit represented by the I-V curve 520 is approximately 3.9V. In addition, FIG. 5C shows that when a voltage of 2.5V is applied to the protection circuit represented by the I-V curve 520, the off-state current of the protection circuit represented by the I-V curve 520 is approximately $6.0 \times 10^{-11}$ A.

When comparing the I-V curves 518, 520, 522, and 524, it can be seen that if more are electrically connected in series, the breakdown voltage can be higher. Furthermore, the slope of the I-V curve decreases as more BJTs are electrically connected in series. That is, when more BJTs electrically connected in series are included by a protection circuit, the on-state resistance of the protection circuit increases.

Comparing the I-V curves shown in FIG. 5B with FIG. 5C, for example, the I-V curves 512 and 518, it can be seen that the size of the emitter electrode of the BJTs included in a protection circuit can influence the slope of the I-V curve. It can be seen that if the emitter electrode of the BJTs is larger, the off-state current increases. If the emitter electrode of the BJTs is larger, the breakdown voltage is smaller.

Based on the results shown in FIGS. 5A, 5B and 5C, the breakdown voltage and the on-state resistance of a protection circuit can be predetermined. The breakdown voltage and the on-state resistance of a protection circuit can be adjusted by the number of BJTs within the protection circuit. In some embodiments, the breakdown voltage and the on-state resistance of the protection circuit 13 of FIG. 1 can be set and adjusted by the number of BJTs.

Figure 6A:
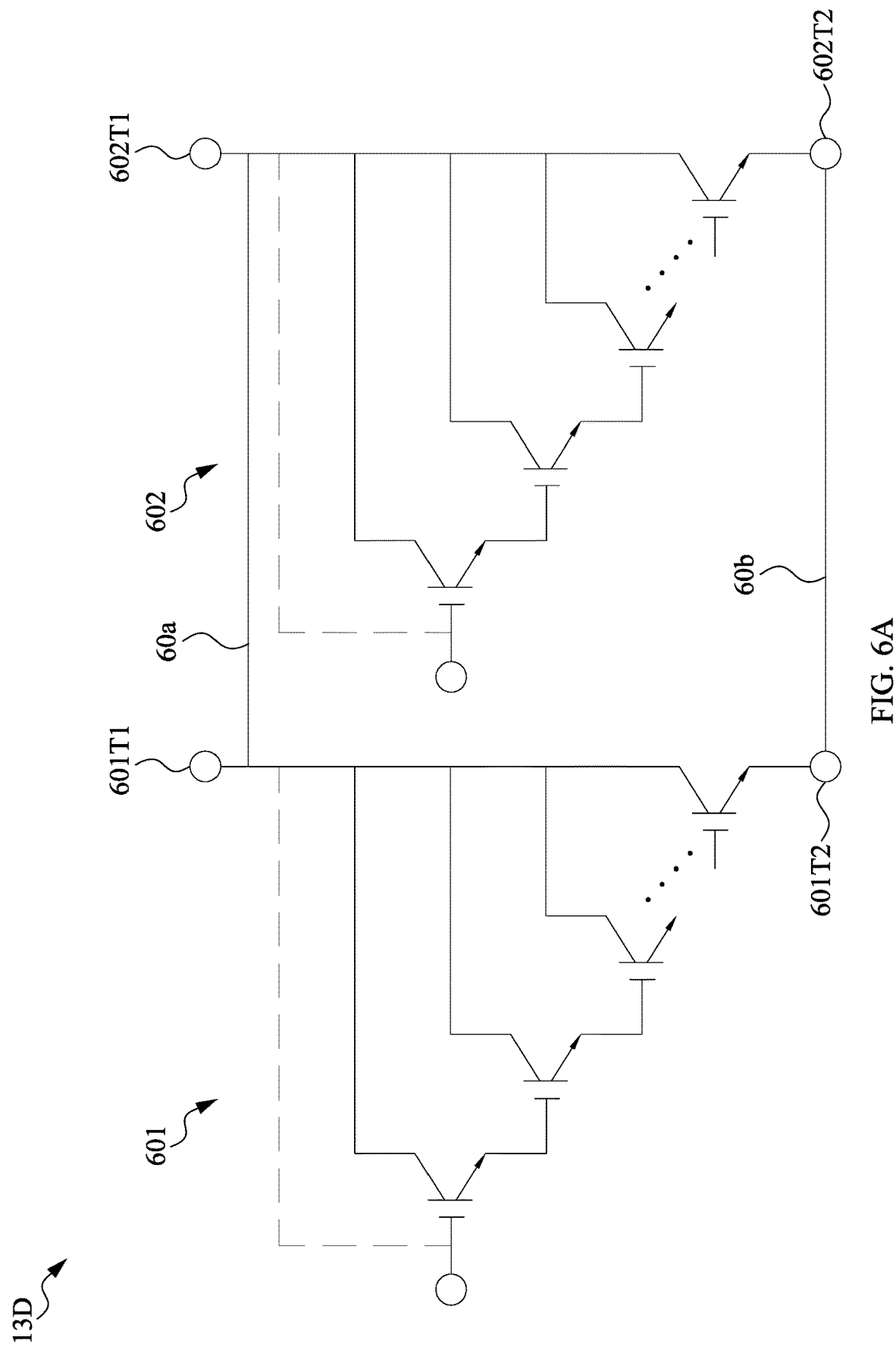
FIG. 6A illustrates a schematic diagram of a protection circuit, in accordance with some embodiments of the present disclosure.

FIG. 6A illustrates a schematic diagram of a protection circuit, in accordance with some embodiments of the present disclosure. The protection circuit 13D can be formed by BJTs electrically connected in parallel.

Referring to FIG. 6A, the protection circuit 13D includes two protection units 601 and 602. Each of the two protection units 601 and 602 has a structure identical to the protection circuit 13C in FIG. 2C. The protection units 601 and 602 are electrically connected in parallel. The protection units 601 and 602 can be electrically connected in parallel by the conductive elements 60a and 60b.

The protection unit 601 can include a quantity N of transistors. The protection unit 602 can include a quantity M of transistors. The on-state resistance of the protection unit 601 can be predetermined by appropriately selecting the quantity N. The on-state resistance of the protection unit 602 can be predetermined by appropriately selecting the quantity M. In some embodiments, the quantity N can be identical to the quantity M. In some embodiments, the quantity N can be different from the quantity M.

The protection unit 601 includes terminals 601T1 and 601T2. The protection unit 602 includes terminals 602T1 and 602T2. The terminal 601T1 can be electrically connected to the terminal 602T1 through the conductive element 60a. The terminal 601T2 can be electrically connected to the terminal 602T2 through the conductive element 60b.

By connecting the protection unit 601 with the protection unit 602 in parallel, the on-state resistance of the protection circuit 13D can be reduced. In some embodiments, the protection circuit 13D can include more than two protection units. In some embodiments, the protection circuit 13D can include a number P of protection units.

By appropriately selecting the values N, M, and P, the protection circuit 13D with expected on-state resistance can be obtained. By appropriately selecting the values N, M, and P, the protection circuit 13D with expected threshold voltage can be obtained.

Figure 6B:
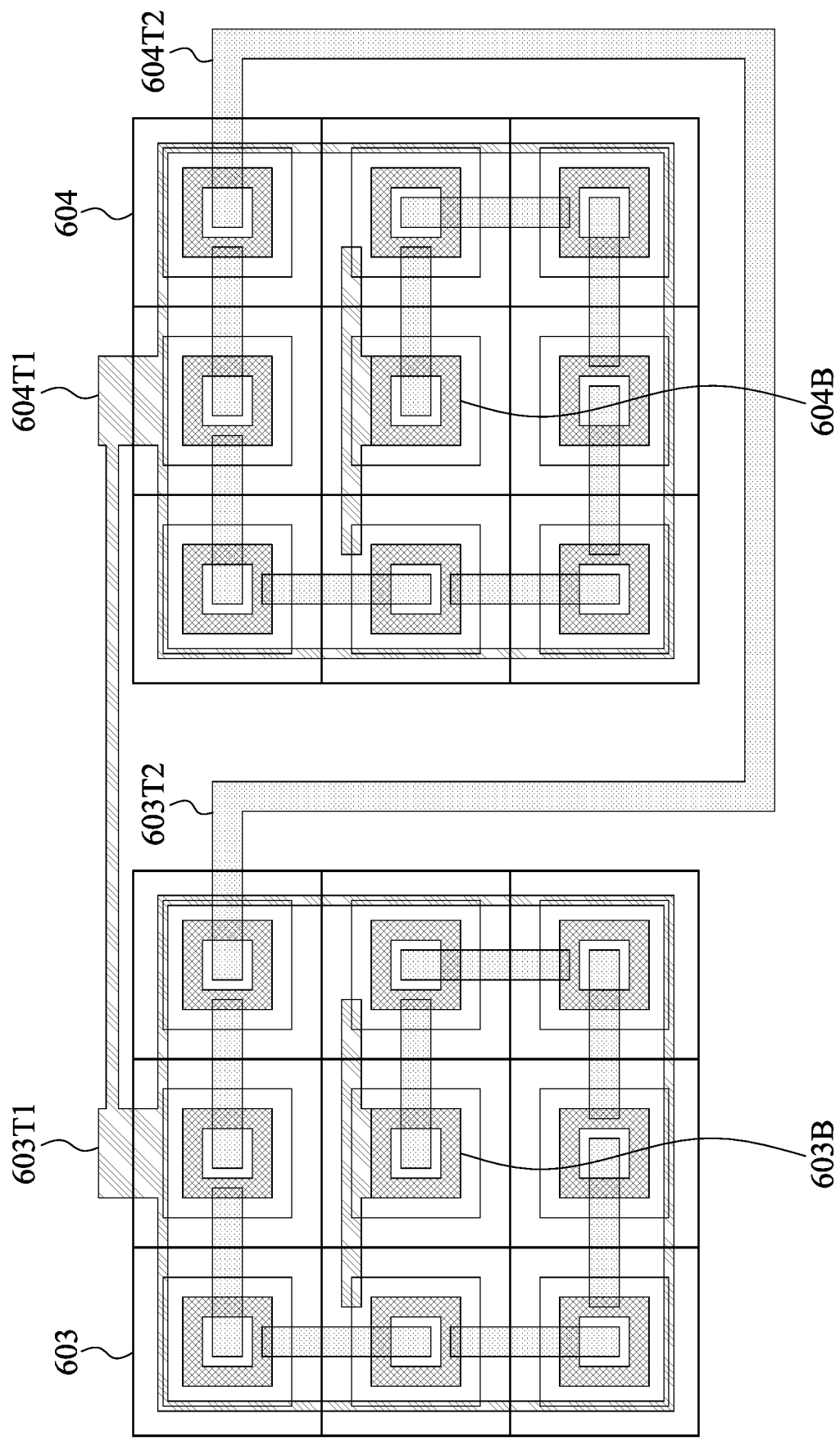
FIG. 6B illustrates a layout of a protection circuit, in accordance with some embodiments of the present disclosure.

FIG. 6B illustrates a layout of a protection circuit, in accordance with some embodiments of the present disclosure. FIG. 6B illustrates a layout of a protection unit 603 electrically connected in parallel with a protection unit 604. The protection unit 603 includes terminals 603T1 and 603T2. The protection unit 604 includes terminals 604T1 and 604T2. The protection unit 603 and the protection unit 604 can be electrically connected in parallel through the conductive terminals 603T1, 603T2, 604T1 and 604T2.

The layout shown in FIG. 6B can correspond to the protection circuit 13D of FIG. 6A. In FIG. 6B, all the collector electrodes of the BJTs within the protection unit 603 are electrically connected. A base electrode of a BJT 603B of the protection unit 603 is electrically connected to its collector electrode. The base electrode of the BJT 603B is electrically connected to the collector electrode of all the other BJTs within the protection unit 603.

In some embodiments, all the collector electrodes of the BJTs within the protection unit 604 are electrically connected. A base electrode of a BJT 604B of the set of BJTs 604 is electrically connected to its collector electrode. The base electrode of the BJT 604B is electrically connected to the collector electrode of all the other BJTs within the protection unit 604.

Although FIG. 6B illustrates the protection unit 603 including nine BJTs, and the protection unit 604 including nine BJTs, it can be contemplated that the protection units 603 and 604 can include varying quantities of BJTs. In some embodiments, the protection unit 603 can include a quantity M of BJTs, and the protection unit 604 can include a quantity N of BJTs. In some embodiments, the quantity M can be identical to the quantity N. In some embodiments, the quantity M can be different from the quantity N.

In some embodiments, the protection unit 603 can utilize fewer than nine BJTs. In such circumstance, not all BJTs within the protection unit 603 are electrically connected in series.

In some embodiments, the protection unit 604 can utilize fewer than nine BJTs. In such circumstance, not all BJTs within the protection unit 604 are electrically connected in series.

In some embodiments, an emitter electrode of the transistors of the protection unit 603 can be the same size as an emitter electrode of the transistors of the protection unit 604. In some embodiments, a first size of an emitter electrode of the transistors of the protection unit 603 can be different than a second size of an emitter electrode of the transistors of the protection unit 604.

Implementing the protection circuit 13 in FIG. 1 using BJTs has many advantages. The breakdown voltage of the protection circuit 13 can be predetermined and adjusted by the number of BJTs electrically connected in series. The on-state resistance of the protection circuit 13 can be predetermined and adjusted by the number of BJTs electrically connected in series. Furthermore, the on-state resistance of the protection circuit 13 can be reduced by electrically connecting protection units in parallel.

In addition, no extra masks are required in manufacture of the BJTs, nor is any extra implantation needed. Thus, costs of the manufacturing process can be reduced. In addition, the protection circuit using BJTs can be applied to advanced technologies. The protection circuit using BJTs is also fully compatible with standard bipolar-CMOS-DMOS (BCD) process.

Figure 7A:
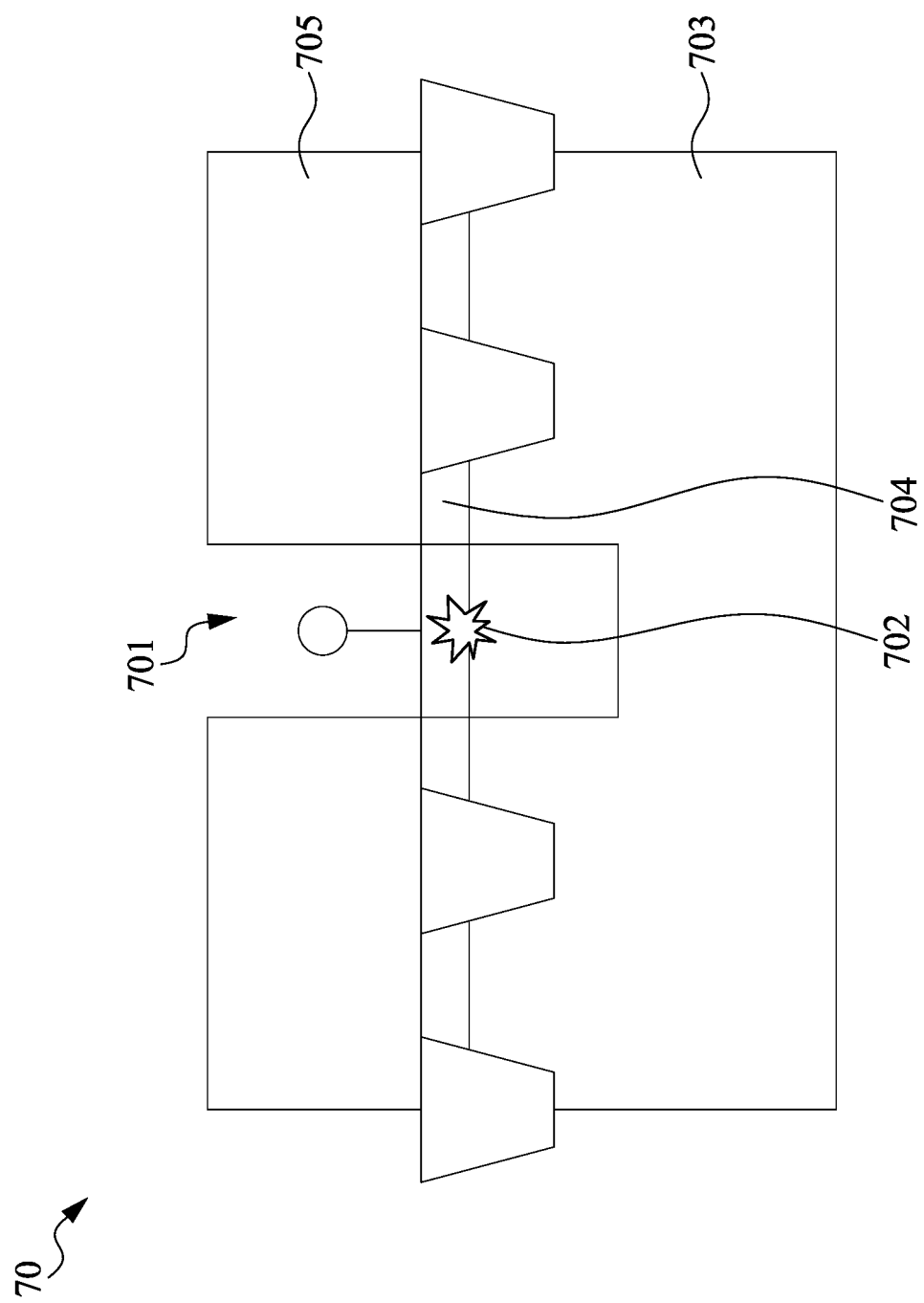
FIG. 7A illustrates a cross-sectional view of a protection circuit, accordance with some comparative embodiments of the present disclosure.

FIG. 7A illustrates a cross-sectional view of a protection circuit, in accordance with some comparative embodiments of the present disclosure. FIG. 7A shows a cross-sectional view of a protection circuit 70.

According to FIG. 7A, a P+ ion 701 is implanted to a region 702 within the P-type well region 703 of a substrate (not shown). The P+ ion 701 is implanted in the region 702 under an N+ well region 704 within the P-type well region 703. The p-n junction breakdown occurs under the N+ well region 704. The ion 701 has a dosage larger than those used in manufacturing other well regions in the process. The ion 701 has higher energy than that used in manufacturing other well regions in the process.

As shown in FIG. 7A, photoresists 705 are used to define the region to be implanted. Therefore, extra masks are needed in this comparative embodiment. In addition, only high-level machines can be used to implant the P+ ions 701 under the N+ well region 704. Therefore, tool constraint is a concern in this comparative embodiment. Furthermore, because the P+ ions 701 are implanted to the N+ well region 704, crystal defects may be generated during the ion implantation.

Figure 7B:
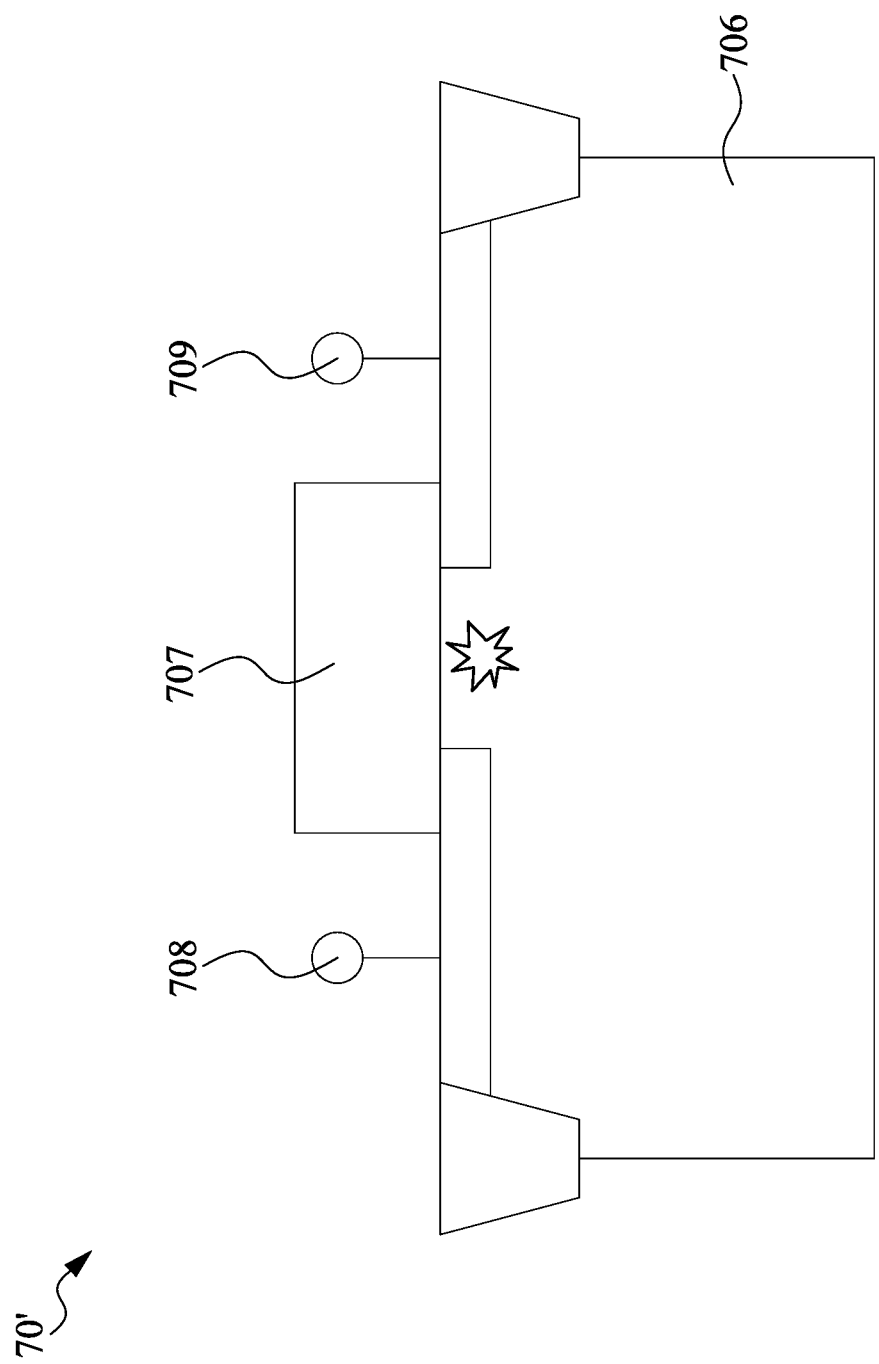
FIG. 7B illustrates a cross-sectional view of a protection circuit, in accordance with some comparative embodiments of the present disclosure.

FIG. 7B illustrates a cross-sectional view of a protection circuit, in accordance with some comparative embodiments of the present disclosure. FIG. 7B shows a cross-sectional view of a protection circuit 70'.

When applying a breakdown voltage between two electrodes 708 and 709 of the protection circuit 70', the p-n junction breakdown occurs near a top surface of the P-type well region 706. The electrons and holes generated in the breakdown will enter the gaps in the resistor protect oxide (RPO) 707. The electrons will be trapped in the RPO 707. Hence, applying the breakdown voltage will damage the RPO 707. The reliability of the RPO 707 is not good, and performance of the protection circuit of FIG. 7B is thus unacceptable.

Figure 8:
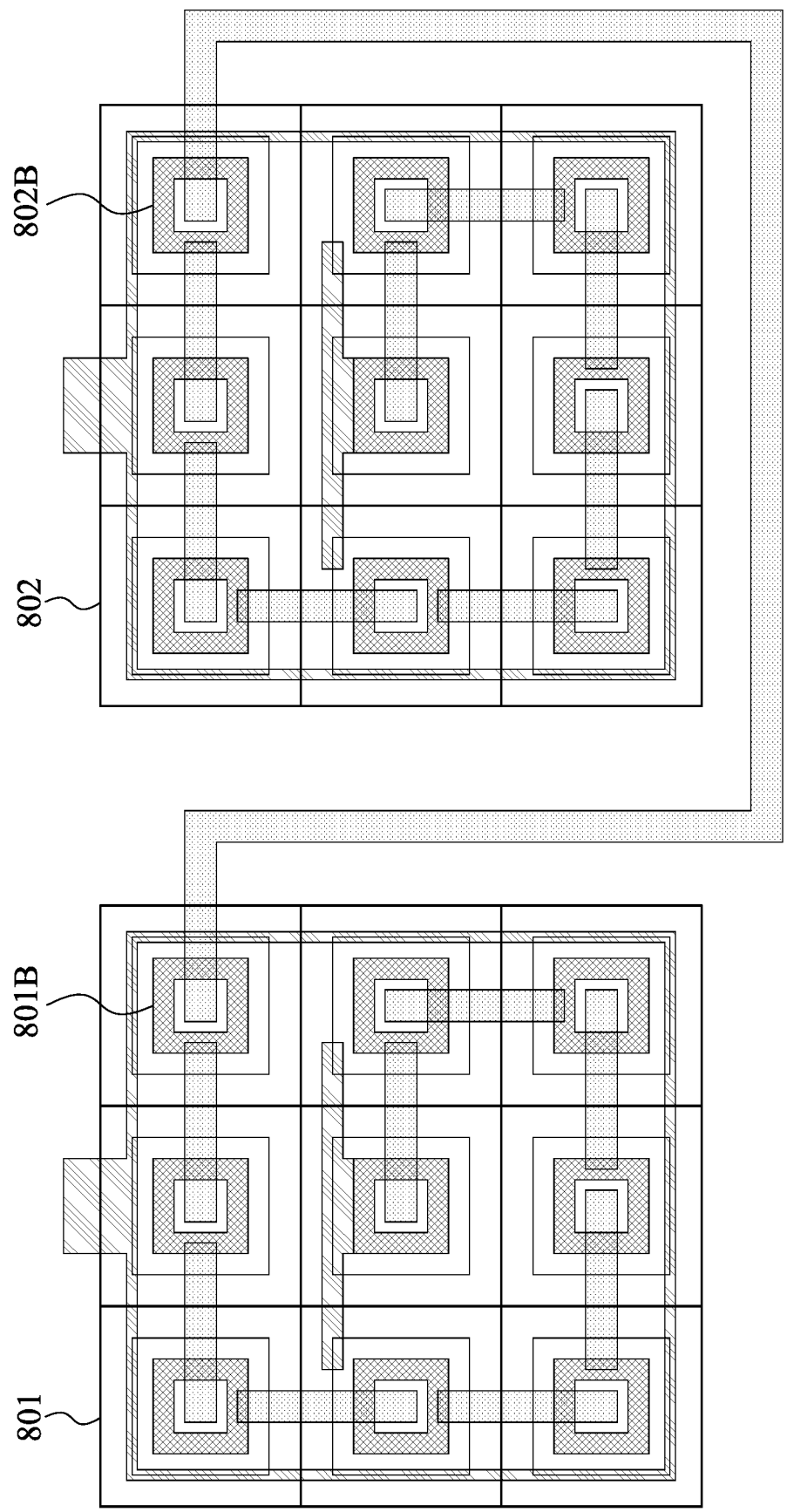
FIG. 8 illustrates a layout of a protection circuit, in accordance with some embodiments of the present disclosure.

FIG. 8 illustrates a layout of a protection circuit, in accordance with some embodiments of the present disclosure. FIG. 8 illustrates a layout of the protection circuit 13 in FIG. 1.

The layout shown in FIG. 8 includes protection units 801 and 802. The emitter electrode of one BJT 801B of the protection unit 801 is electrically connected to the emitter electrode of one BJT 802B of the protection unit 802.

The layout shown in FIG. 8 may function like a transient voltage suppression (TVS) diode. A TVS diode can be formed by two Zener diodes with their anodes connected. When spike voltage enters the output circuit 10, the TVS diode can guide spike voltage to a terminal of a lower potential (usually ground). This protects the output circuit 10 from damage.

Figure 9A:
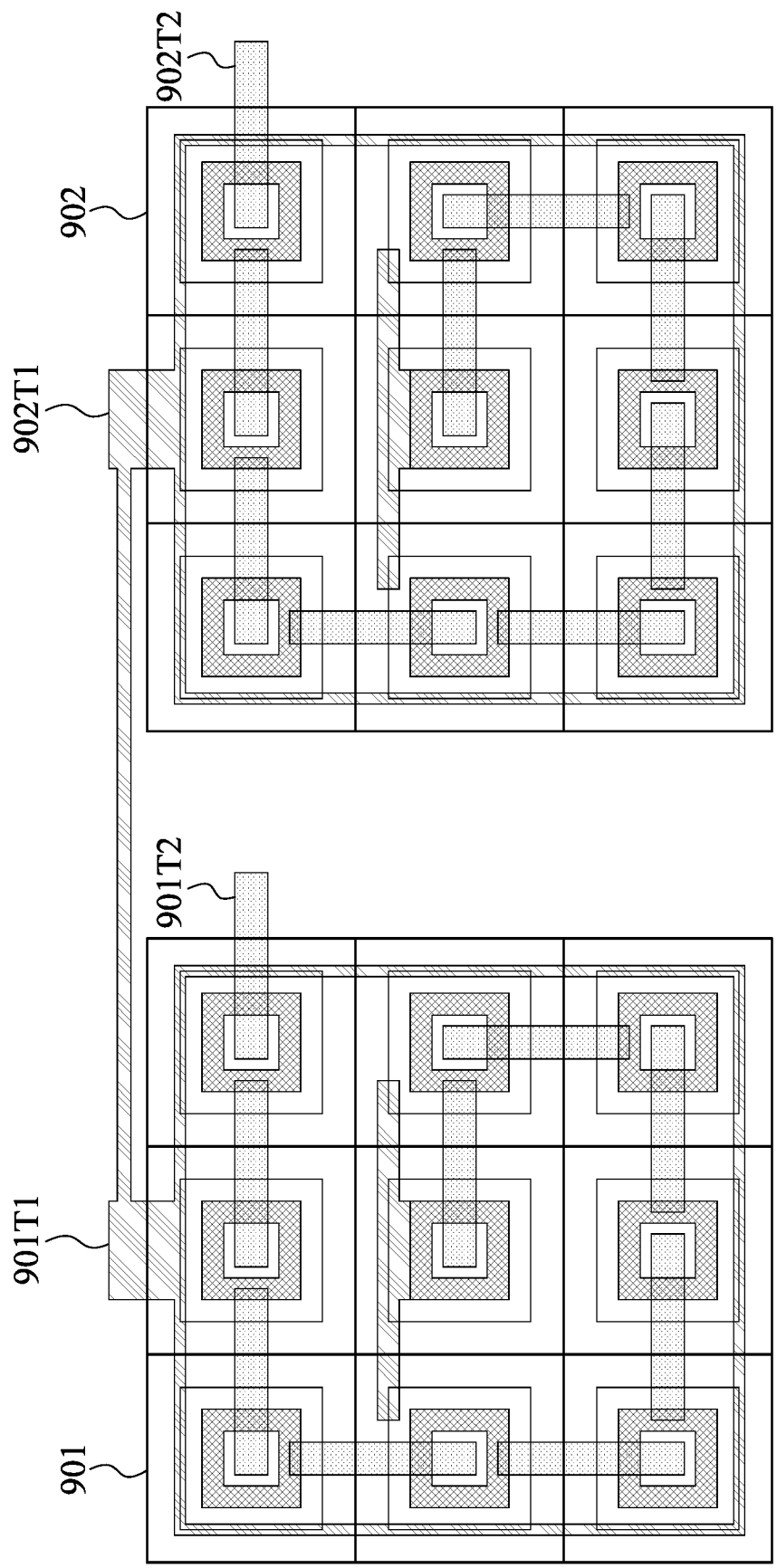
FIG. 9A illustrates a layout of a protection circuit, in accordance with some embodiments of the present disclosure.

FIG. 9A illustrates a layout of a protection circuit, in accordance with some embodiments of the present disclosure.

The layout shown in FIG. 9A includes protection units 901 and 902.

The protection unit 901 includes terminals 901T1 and 901T2. The protection unit 902 includes terminals 902T1 and 902T2. The terminal 901T1 can be electrically connected to the terminal 902T1. The collector electrodes of the BJTs of the protection unit 901 are electrically connected to the collector electrodes of the BJTs of the protection unit 902.

Figure 9B:
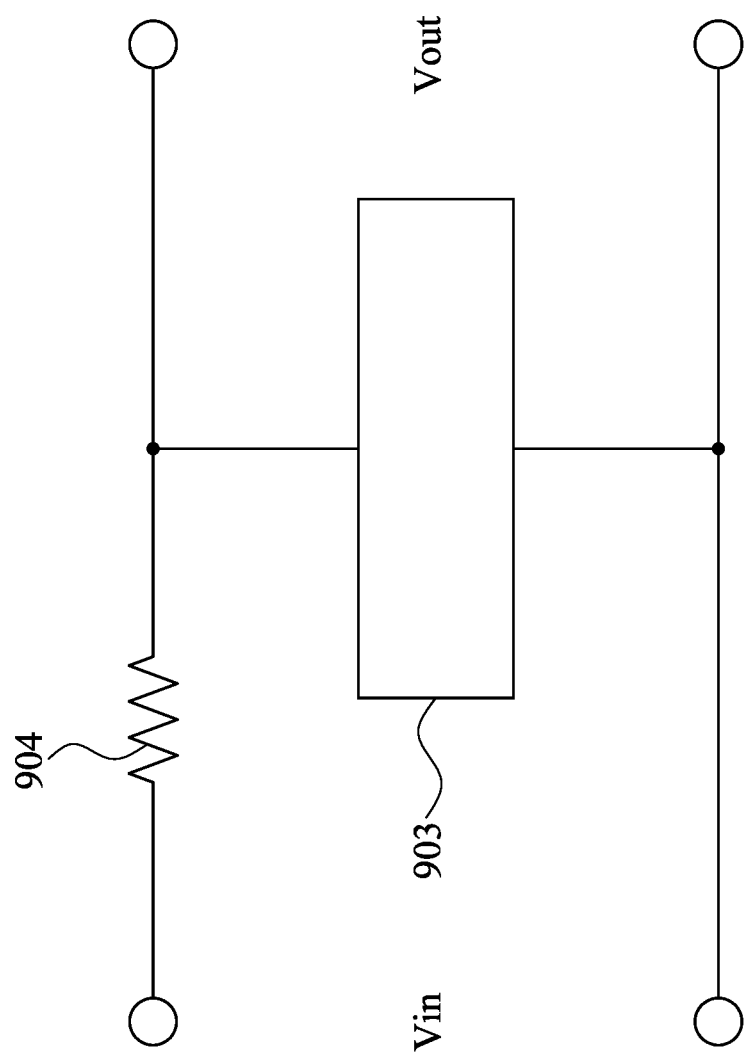
FIG. 9B illustrates a schematic diagram of a semiconductor device, in accordance with some embodiments of the present disclosure.

FIG. 9B illustrates a schematic diagram of a semiconductor device, in accordance with some embodiments of the present disclosure.

The layout shown in FIG. 9A can be used as the protection circuit 903 in FIG. 9B. The layout shown in FIG. 9A may function like a "back-to-back diode." The back-to-back diode may be formed by two Zener diodes with their cathodes connected. A resistor 904 is disposed between a terminal of an input voltage $V_{in}$ and a terminal of the protection circuit 903. The resistor 904 is disposed between the terminal of the input voltage $V_{in}$ and a terminal of an output voltage $V_{OUT}$. The protection circuit 903 can be electrically connected across the output voltage $V_{OUT}$. That is, the terminals 901T2 and 902T2 can be electrically connected across the output voltage $V_{OUT}$.

When spike voltage is generated as an input voltage, the resistor 904 and the protection circuit 903 can guide spike voltage to a terminal of a lower potential (usually ground). This prevents the circuits of an IC from damage.

Figure 10:
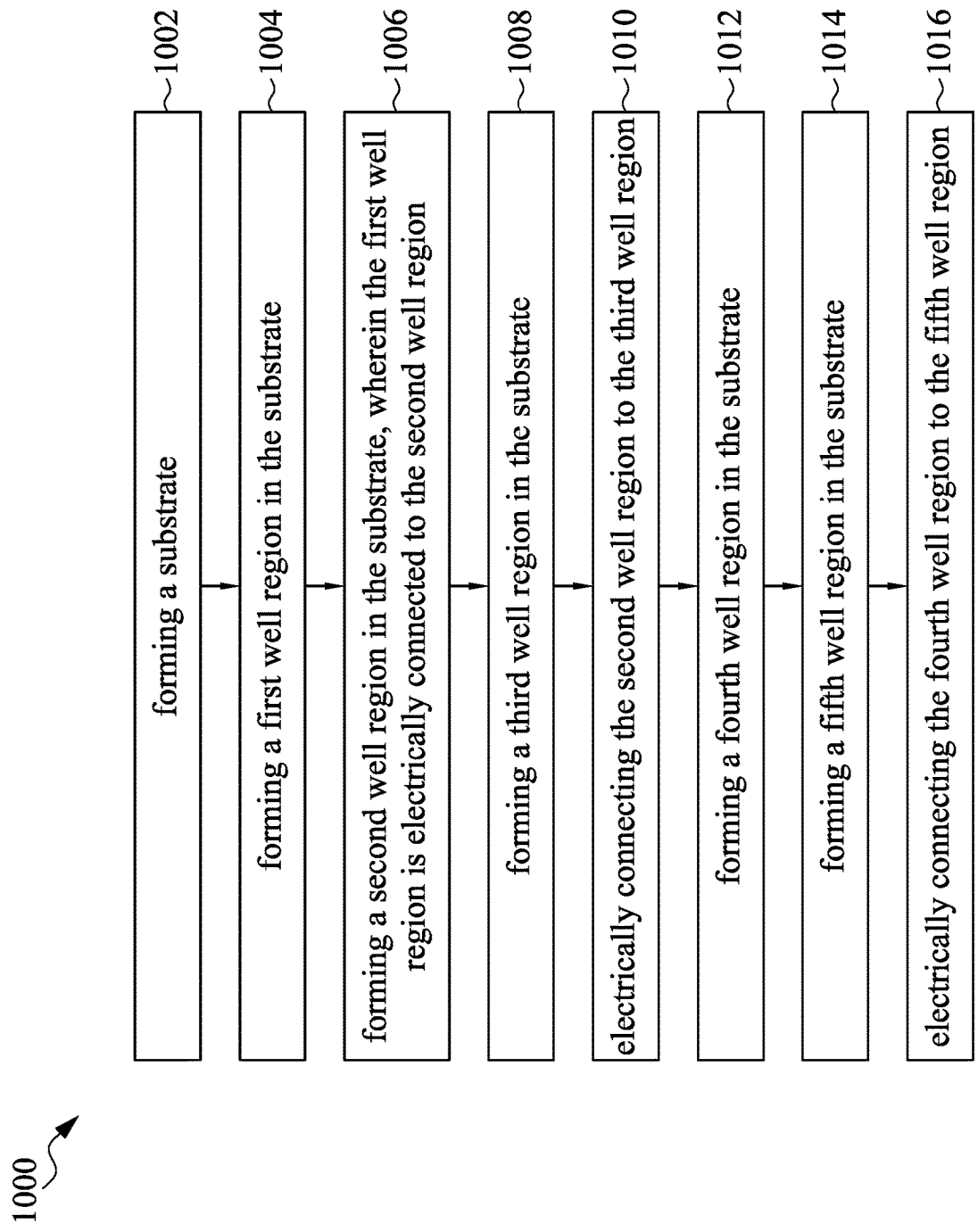
FIG. 10 illustrates a flowchart of manufacturing a semiconductor device, in accordance with some embodiments of the present disclosure.

FIG. 10 illustrates a flow chart including the operations of manufacturing a semiconductor device, in accordance with some embodiments of the present disclosure. FIG. 10 shows a flowchart 1000 of manufacturing a semiconductor device, including operations 1002, 1004, 1006, 1008, 1010, 1012, 1014 and 1016. Although the operations 1002, 1004, 1006, 1008, 1010, 1012, 1014 and 1016 of FIG. 10 are depicted in sequence, it can be contemplated that the operations 1002, 1004, 1006, 1008, 1010, 1012, 1014 and 1016 can be performed in an order other than that shown in FIG. 10.

In the operation 1002, a substrate of a first type is formed. In some embodiments, the substrate can be a p-type substrate. In other embodiments, the substrate can be an n-type substrate. The operation 1002 can be used to form the substrate 30 in FIG. 3A.

In the operation 1004, a first well region (B) is formed in the substrate. The first well region is formed of a first type. In some embodiments, the first well region can be a p-type well region. In other embodiments, the first well region can be an n-type well region. The operation 1004 can be used to form the well region 307 in FIG. 3A.

In the operation 1006, a second well region (C) is formed in the substrate. The second well region is formed of a second type different than the first type. In some embodiments, the second well region can be a p-type well region. In other embodiments, the second well region can be an n-type well region. The operation 1006 can be used to form the well region 308 in FIG. 3A. The first well region of the first type is electrically connected to the second well region of the second type.

In the operation 1008, a third well region (C) of the second type is formed in the substrate. In some embodiments, the third well region can be a p-type well region. In other embodiments, the third well region can be an n-type well region. The operation 1008 can be used to form the well region 312 in FIG. 3A.

In the operation 1010, the second well region of the second type is electrically connected to the third well region of the second type. The second well region and the third well region are electrically connected via a conductive element. The conductive element can include a metal material.

In the operation 1012, a fourth well region (B) of the first type is formed in the substrate. In some embodiments, the fourth well region can be a p-type well region. In other embodiments, the fourth well region can be an n-type well region. The operation 1012 can be used to form the well region 311 in FIG. 3B.

In the operation 1014, a fifth well region (E) of the second type is formed in the substrate. In some embodiments, the fifth well region can be a p-type well region. In other embodiments, the fifth well region can be an n-type well region. The operation 1014 can be used to form the well region 309 in FIG. 3B.

In the operation 1016, the fourth well region of the first type is electrically connected to the fifth well region of second type. The fourth well region and the fifth well region are electrically connected via a conductive element. The conductive element can include a metal material.

Some embodiments of the present disclosure provide a semiconductor device. The semiconductor device comprises an output circuit configured to be electrically connected between a driving circuit and an external load circuit, and a protection circuit electrically connected to the output circuit and the driving circuit. The protection circuit comprises a first transistor having a base electrode, a collector electrode and an emitter electrode and a second transistor having a base electrode, a collector electrode and an emitter electrode. The base electrode of the first transistor is electrically connected to the collector electrode of the second transistor.

Some embodiments of the present disclosure provide a semiconductor device. The semiconductor device comprises an output circuit configured to be electrically connected between a driving circuit and an external load circuit, and a protection circuit electrically connected to the output circuit and the driving circuit. The protection circuit comprises a first quantity of transistors, wherein collector electrodes of the first quantity of transistors are electrically connected, and a base electrode of a first transistor of the first quantity of transistors is electrically connected to a collector electrode of a second transistor of the first quantity of transistors.

Some embodiments of the present disclosure provide a method of manufacturing a semiconductor device. The method comprises: forming a substrate, forming a first well region in the substrate, forming a second well region in the substrate, wherein the first well region is electrically connected to the second well region, forming a third well region in the substrate, and electrically connecting the second well region to the third well region.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, acid alterations herein without departing from the spirit and scope of the present disclosure.

What is claimed is:

1. A semiconductor device, comprising:
   an output circuit configured to be electrically connected between a driving circuit and an external load circuit; and
   a protection circuit electrically connected to the output circuit and the driving circuit, the protection circuit comprises:
      a first transistor having a base electrode, a collector electrode and an emitter electrode; and
      a second transistor having a base electrode, a collector electrode and an emitter electrode, wherein the base electrode of the first transistor is electrically connected to the collector electrode of the second transistor, and wherein a first size of the emitter electrode of the first transistor is different than a second size of the emitter electrode of the second transistor.

2. The semiconductor device of claim 1, wherein the emitter electrode of the first transistor is electrically connected to the base electrode of the second transistor.

3. The semiconductor device of claim 1, wherein the collector electrode of the first transistor is electrically connected to the collector electrode of the second transistor.

4. The semiconductor device of claim 1, wherein the emitter electrode of the second transistor is electrically connected to the output circuit.

5. The semiconductor device of claim 1, wherein the first transistor and the second transistor are NPN bipolar junction transistors (BJT).

6. The semiconductor device of claim 1, wherein the first transistor and the second transistor are PNP bipolar junction transistors (BJT).

7. The semiconductor device of claim 1, wherein the base electrode of the first transistor is electrically connected to the collector electrode of the first transistor.

8. The semiconductor device of claim 1, wherein the protection circuit further comprises a third transistor having a base electrode, a collector electrode and an emitter electrode, wherein the collector electrode of the third transistor is electrically connected to the base electrode of the first transistor.

9. The semiconductor device of claim 1, wherein a breakdown voltage of the first and second transistors ranges approximately from 0.6V to 0.8V.

10. A semiconductor device, comprising:
an output circuit configured to be electrically connected between a driving circuit and an external load circuit;
a protection circuit electrically connected to the output circuit and the driving circuit, the protection circuit comprises:
a first quantity of transistors;
wherein collector electrodes of the first quantity of transistors are electrically connected, and a base electrode of a first transistor of the first quantity of transistors is electrically connected to a collector electrode of a second transistor of the first quantity of transistors, and wherein a first size of an emitter electrode of the first transistor of the first quantity of transistors is different than a second size of an emitter electrode of the second transistor of the first quantity of transistors.

11. The semiconductor device of claim 10, further comprising a second quantity of transistors, wherein the collector electrodes of the second quantity of transistors are electrically connected, and a base electrode of a first transistor of the second quantity of transistors is electrically connected to a collector electrode of a second transistor of the second quantity of transistors.

12. The semiconductor device of claim 11, wherein the first quantity is identical to the second quantity.

13. The semiconductor device of claim 11, wherein the first quantity is different from the second quantity.

14. The semiconductor device of claim 11, wherein the first quantity of transistors and the second quantity of transistors are arranged in parallel.

15. The semiconductor device of claim 14, wherein the collector electrodes of the first quantity of transistors are electrically connected to the collector electrodes of the second quantity of transistors.

16. A method of manufacturing a semiconductor device, comprising:
forming a substrate;
forming a first well region in the substrate;
forming a second well region in the substrate, wherein the first well region is electrically connected to the second well region and wherein a conductivity type of the first well region is different from a conductivity type of the second well region;
forming a third well region in the substrate; and
forming a fourth well region in the substrate;
forming a fifth well region in the substrate, wherein a conductivity type of the fourth well region is different from a conductivity type of the fifth well region;
electrically connecting the second well region to the third well region.

17. The method of claim 16, further comprising:
electrically connecting the fourth well region to the fifth well region.

18. The method of claim 16, wherein the second well region and the third well region are electrically connected via a conductive element.

19. The method of claim 17, wherein the fourth well region and the fifth well region are electrically connected via a conductive element.

20. The method of claim 16, wherein a conductivity type of the second well region is different from a conductivity type of the third well region.

* * * * *